(12) United States Patent
Nakamura et al.

(10) Patent No.: US 9,893,539 B2
(45) Date of Patent: Feb. 13, 2018

(54) POWER STORAGE APPARATUS AND CONTROL METHOD FOR A POWER STORAGE APPARATUS

(71) Applicant: SONY CORPORATION, Tokyo (JP)

(72) Inventors: Kazuo Nakamura, Kanagawa (JP); Atsushi Ozawa, Kanagawa (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 65 days.

(21) Appl. No.: 14/902,334

(22) PCT Filed: May 29, 2014

(86) PCT No.: PCT/JP2014/002837
§ 371 (c)(1),
(2) Date: Dec. 30, 2015

(87) PCT Pub. No.: WO2015/001703
PCT Pub. Date: Jan. 8, 2015

(65) Prior Publication Data
US 2016/0190828 A1    Jun. 30, 2016

(30) Foreign Application Priority Data

Jul. 3, 2013    (JP) .................................. 2013-139368

(51) Int. Cl.
*H02J 7/00* (2006.01)
*H01M 10/48* (2006.01)
(Continued)

(52) U.S. Cl.
CPC ........... *H02J 7/0014* (2013.01); *H01M 10/48* (2013.01); *H02J 7/0016* (2013.01); *H02J 7/0019* (2013.01);
(Continued)

(58) Field of Classification Search
CPC ...................................................... H02J 7/0014
(Continued)

(56) References Cited

U.S. PATENT DOCUMENTS

2004/0135546 A1* 7/2004 Chertok ................ B60L 11/185
320/118

FOREIGN PATENT DOCUMENTS

JP    H10-032936 A    2/1998
JP    H11-176483 A    7/1999
(Continued)

*Primary Examiner* — Edward Tso
*Assistant Examiner* — Ahmed Omar
(74) *Attorney, Agent, or Firm* — Chip Law Group

(57) ABSTRACT

[Object] To enable charging/discharging amounts of secondary batteries connected in series to be accurately obtained without increasing the costs.

[Solving Means] A power storage apparatus includes a battery section in which a plurality of power storage element sections each including at least one power storage element are connected in series, a cell-balancing circuit that are connected in parallel to a plurality of power storage element sections and performs a cell-balancing operation between plurality of power storage element sections, a control unit that controls the cell-balancing current flowing through the cell-balancing circuit, and an entire-current measurement section that measures a current value of an entire current flowing through the entire battery section and a cell-balancing current measurement section that measures a current value of the cell-balancing current.

7 Claims, 18 Drawing Sheets

(51) Int. Cl.
*H01M 10/42* (2006.01)
*G01R 31/36* (2006.01)

(52) U.S. Cl.
CPC ........ *H02J 7/0021* (2013.01); *G01R 31/3658* (2013.01); *H01M 2010/4271* (2013.01); *H01M 2220/10* (2013.01)

(58) Field of Classification Search
USPC .......................................... 320/118, 119, 122
See application file for complete search history.

(56) References Cited

FOREIGN PATENT DOCUMENTS

| | | |
|---|---|---|
| JP | 2003-289629 A | 10/2003 |
| JP | 2006-507790 A | 3/2006 |
| JP | 2008-011657 A | 1/2008 |

\* cited by examiner

POWER STORAGE APPARATUS AND CONTROL METHOD FOR A POWER STORAGE APPARATUS

TECHNICAL FIELD

The present disclosure relates to a power storage apparatus and a control method for a power storage apparatus.

BACKGROUND ART

In recent years, a power generation technique utilizing natural energy such as solar light and a smart grid technique efficiently operating power systems making full use of information techniques have attracted attention. For the power generation utilizing the natural energy, it is difficult to manage a power generation amount to be constant due to the influence of the weather and the like. Therefore, in a power system in which a large number of natural energy-based power generation systems are connected, there is a fear that a system accident occurs due to unbalance of supply and demand and a power failure occurs in the worst case. For the purpose of avoiding such situation, for example, a power storage module including, as a component, a unit battery of a secondary battery such as a lithium-ion battery (also referred to as single battery or cell. It will be appropriately referred to as battery cell in following description) or a battery block is used. Some of such power storage modules are capable of performing megawatt output.

The power storage module configures the battery block by connecting a plurality of (e.g. 4, 8, 10) battery cells in parallel. The series connection of a large number of battery blocks is housed in an outer case for configuring the power storage module. In addition, in the case where a large number of battery cells are used for generating a large output, a battery system in which a plurality of power storage modules are connected in series and a common control apparatus is provided for the plurality of power storage modules is known. Each power storage module includes a module controller and is configured to perform communication between the module controller and the control apparatus via a communication means.

In the case where a plurality of battery cells are used, even when one of the plurality of battery cells reaches a lower limit voltage during discharging, the other battery cells may not still reach the lower limit voltage due to a difference or the like in self-discharge of the battery cells. When the battery cell is charged again from this state, some battery cells may not be fully charged and a problem in that those battery cells cannot work sufficiently arises. The plurality of battery cells are charge/discharged from the state in which there are variations in the charging state among the plurality of battery cells connected in series, the same current flows through the plurality of battery cells connected in series. Therefore, the variations in the charging state among the plurality of cells are kept. In addition, if this state is left as it is, there is a fear that variations increase.

From the past, in an assembled battery configured by connecting a plurality of battery cells in series, a voltage equalizer circuit (hereinafter, will be referred to as cell-balancing circuit) that equalizes the voltages of the battery cells is used for the purposes of using a battery's maximum capacity, preventing the occurrence of the battery variations due to deterioration, and the like. For the cell-balancing circuit, various configurations are known, for example, as shown in Patent Documents 1 and 2.

Patent Document 1: Japanese Patent Application Laid-open No. 2003-289629
Patent Document 2: Japanese Patent Application Laid-open No. HEI 11-176483

SUMMARY OF INVENTION

Problem to be solved by the Invention

The cell-balancing circuit described in Patent Document 1 sets a bypass circuit including a bypass switch for each cell. By turning on the bypass switch for causing a charge current to flow to the bypass circuit in a fully charged cell, overcharge of the cell is avoided.

In the cell-balancing circuit described in Patent Document 2, a transformer including a primary side to which each battery is connected and a secondary side that is connected to a module terminal is used. By switching a switch disposed on the secondary side at a predetermined frequency, transferring energy via a primary side coil and a secondary side coil is repeated and the voltages of the cells are equalized.

In addition, by accurately knowing an inner state of the battery, it is possible to determine a degree of deterioration or the like of the battery. In order to know the inner state of the battery, a method of obtaining a charging/discharging amount by measuring and integrating a current flowing through the battery, a method of estimating from on the charging/discharging amount obtained based on measured battery voltage and battery current with an equalizer circuit-based model, and the like are known. If both of a current during normal charging/discharging and a current flowing during cell balancing are not considered, accurate information cannot be obtained.

In Patent Document 1, the battery voltage is set as a determination criteria. When the cell-balancing function is activated, although the entire current flowing through the entire series circuit of the batteries is accurately integrated, a current of each battery cell is measured or integrated. Therefore, a charging/discharging amount of each battery cell is unknown and it is difficult to obtain an accurate capacity of the entire module.

As shown in FIG. 2 of Patent Document 2, current detectors D1, D2, . . . , $D_{n-1}$ are connected and a current flowing through connection portions of the battery cells is detected. In this configuration, the current detector is provided for each battery cell. Therefore, if a power storage module is configured by connecting a large number of batteries, there is a problem in that the number of components increases and the costs increase due to the complexity of circuit wires.

Therefore, it is an object of the present disclosure to provide a power storage apparatus and a control method for a power storage apparatus, by which charging/discharging amounts of secondary batteries connected in series for configuring a power storage module can be accurately obtained without increasing the costs.

Means for Solving the Problem

In order to solve the above-mentioned problems, the present disclosure is a power storage apparatus including a battery section in which a plurality of power storage element sections each including at least one power storage element are connected in series, a cell-balancing circuit that is connected in parallel to a plurality of power storage element sections and performs a cell-balancing operation between plurality of power storage element sections, a control unit that controls the cell-balancing current flowing through the cell-balancing circuit, and an entire-current measurement section that measures a current value of an entire current flowing through the entire battery section and a cell-balancing current measurement section that measures a current value of the cell-balancing current.

Effects of the Invention

According to the present disclosure, it is possible to accurately determine a charging/discharging amount of each power storage element by a fewer current measurement circuits.

MODE(S) FOR CARRYING OUT THE INVENTION

Hereinafter, embodiments will be described. Note that descriptions thereof will be made in the following order.
<1. First Embodiment of Present Disclosure>
<2. Second Embodiment of Present Disclosure>
<3. Third Embodiment of Present Disclosure>
<4. Fourth Embodiment of Present Disclosure>
<5. Application Examples>
<6. Modified Example>

It will be appreciated that the embodiments described below are suitable specific examples and have technically favorable various limitations but the scope of the present disclosure is not limited to these embodiments unless otherwise indicated herein.

<1. First Embodiment of Present Disclosure>

Figure 1:
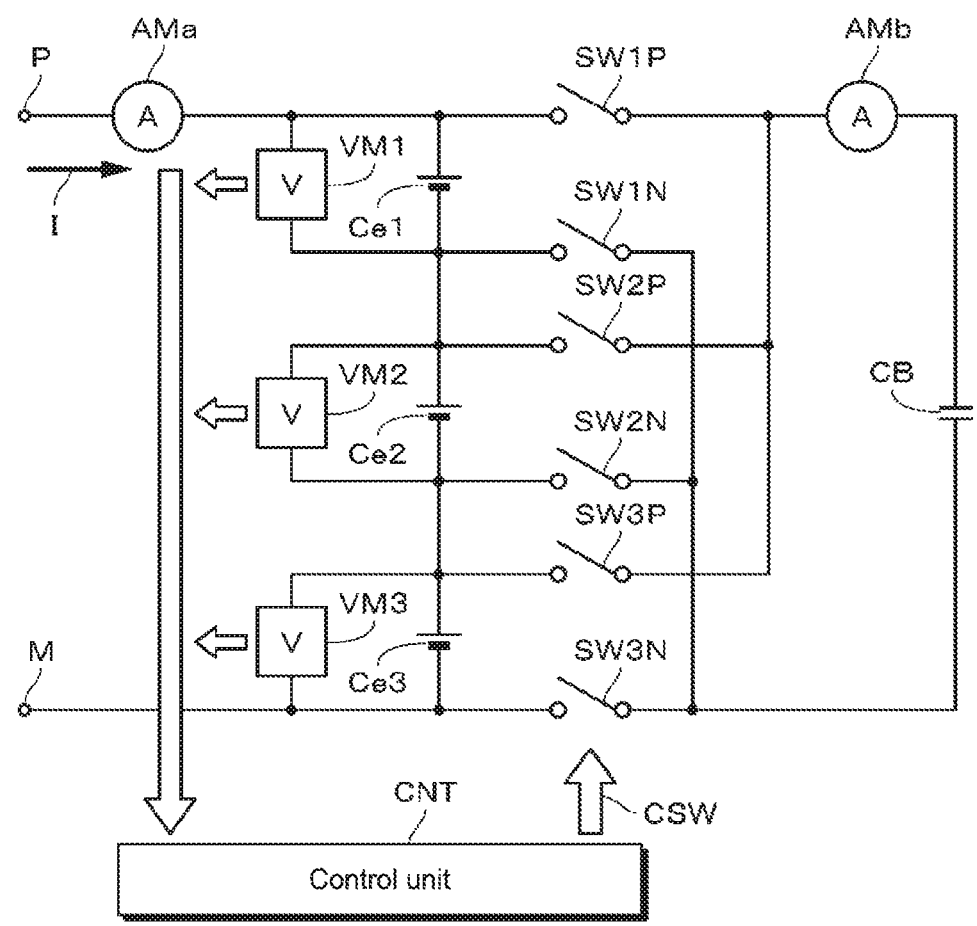
FIG. 1 A connection diagram showing a first embodiment of the present disclosure.

Referring to FIG. 1, a first embodiment of the present disclosure will be described. For example, a battery section in which battery cells Ce1, Ce2, and Ce3 of a lithium-ion secondary battery are connected in series to one another is configured. A positive side of the series connection of the battery cells Ce1, Ce2, and Ce3 is connected to a module terminal P via a current measurement circuit AMa. Its negative side is connected to a module terminal M. The current measurement circuit AMa measures an entire current (hereinafter, referred to as module current) I that flows through the series connection of the battery cells Ce1 to Ce3. A current measurement circuit or the like using a shunt resistance and a Hall element can be used as the current measurement circuit AMa.

With respect to module terminals P and M, a charging circuit is connected thereto during charging and a load is connected thereto during discharging. Note that the battery cells may be replaced by a battery block in which the plurality of battery cells are connected in series and/or in parallel. In addition, the number of battery cells connected in series or battery blocks can be any number other than three.

For cell balancing, positive sides of the battery cells Ce1 to Ce3 are connected to one electrode of a cell-balancing capacitance CB via switches SW1P, SW2P, and SW3P and a current measurement circuit AMb. Negative sides of the battery cells Ce1 to Ce3 are connected to the other electrode of the cell-balancing capacitance CB via switches SW1N, SW2N, and SW3N. Semiconductor switching elements such as an FET (Field Effect Transistor) and an IGBT (Insulated Gate Bipolar Transistor) are used for the switches SW1P to SW3P and SW1N to SW3N.

In addition, voltages of the battery cells Ce1 to Ce3 are measured by voltage measurement circuits VM1, VM2, and VM3. The measured voltage values are converted into digital signals by an A/D converter (not shown) and supplied to a control unit CNT. For the voltage measurement circuits VM1 to VM3, for example, a configuration in which both ends of the battery cell are connected to an input of an operational amplifier can be used.

The control unit CNT is a micro computer configured by, for example, a CPU (Central Processing Unit), a ROM (Read Only Memory), or a RAM (Random Access Memory). The control unit CNT integrally controls respective sections of a power storage module by executing a program stored in the ROM.

The control unit CNT controls a charge operation, a discharge operation, and a cell-balancing operation of the battery cells Ce1 to Ce3. The control unit CNT receives data of the voltages of the battery cells and generates a switch control signal CSW for controlling the switches to make the voltages of the battery cells equal. In addition, charging/discharging amounts of the battery cells that are obtained from the data of the current values measured by the current measurement circuits AMa and AMb are stored in the memory of the control unit CNT.

General cell-balancing control will be described. First, it is assumed that all the battery cells Ce1 to Ce3 are fully charged. Next, it is assumed that the battery cells are discharged, variations occurs in the discharging amount, and one battery cell Ce1, for example, reaches a lower limit voltage. Due to the variations among the battery cells, the other battery cells Ce2 and Ce3 still do not reach the lower limit voltage. For example, different self-discharge amounts result in the discharging amount variations among the battery cells.

The charging starts from this state. Then, a battery cell whose remaining capacity is largest when the voltage of the battery cell Ce1 reaches the lower limit voltage, for example, the battery cell Ce2 first reaches full capacity. At this time, the battery cell Ce1 is not fully charged. Therefore, its discharging amount in this case is smaller than a discharging amount that can be obtained in the case where it is fully charged.

In order to solve this problem, by transferring the power from the battery cell Ce2 whose remaining capacity is largest (highest potential) when the battery cell Ce1 reaches the lower limit voltage to the other battery cell Ce1 whose capacity is smallest (lowest potential) for making the remaining capacity approximately equal. Then, by charging the battery cells Ce1 to Ce3, the three battery cells can be charged to approximately the full charge voltage. Actually, such a process is repeated a plurality of times.

The above-mentioned control is called active bottom cell-balancing control. The bottom cell-balancing control can prevent a decrease in the dischargeable amount. A method of discharging the other battery cells for making the potentials equal to that of the battery cell having a lowest potential is called passive bottom cell-balancing control. The active method is more favorable than the passive method because it can efficiently use the capacity.

An active top balance control will be described. First, it is assumed that all the battery cells are fully charged. Next, it is assumed that the battery cells are discharged. The charging starts. Then, a voltage of a battery cell, for example, the battery cell Ce1 first reaches an upper limit voltage. At this time, the voltages of the battery cells Ce2 and Ce3 still do not reach the upper limit voltage. Therefore, their charging amounts are smaller.

In order to solve this problem, by transferring the power from the battery cell Ce1 having a largest capacity (highest potential) when the battery cell Ce1 reaches the upper limit voltage to the other battery cell Ce2 having a lowest capacity (lowest potential), the remaining capacity is made approximately equal. Then, by charging the battery cells Ce1 to Ce3, the three battery cells can be charged to approximately the full charge voltage. Actually, such a process is repeated a plurality of times.

The above-mentioned control is called active top cell-balancing control. The top cell-balancing control can prevent a decrease in the chargeable amount. A method of discharging the battery cells for making their potentials equal to the potential of the battery cell having a lowest potential is called passive top cell-balancing control. The active method is more favorable than the passive method because it can efficiently use the capacity.

The present disclosure is also applicable to any of the above-mentioned cell-balancing methods. In addition, it is also applicable to the case of controlling, in a system in which a plurality of power storage modules are connected, the balance among the power storage modules.

Figure 2:
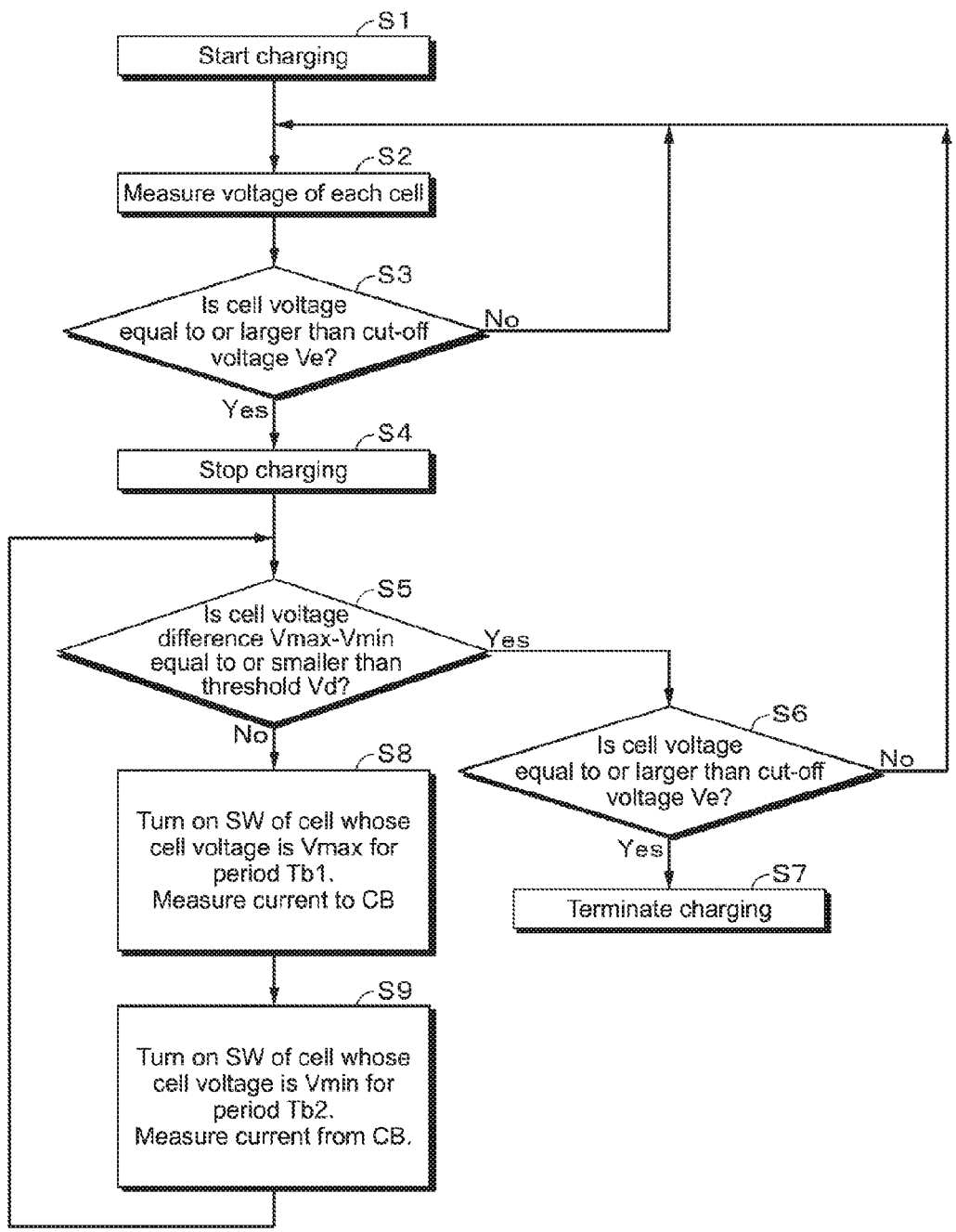
FIG. 2 A flowchart for describing the first embodiment of the present disclosure.

A control example of a cell-balancing operation that is performed by the control unit CNT will be described with reference to a flowchart of FIG. 2.

Step S1: Charging the battery cells Ce1 to Ce3 is started.
Step S2: A voltage of each battery cell is measured.

Step S3: Whether or not the voltage of the battery cell is equal to or higher than a cut-off voltage is determined. The cut-off voltage Ve is a voltage when the charging is to be terminated. It is determined whether or not the maximum voltage among the battery cells Ce1 to Ce3 is equal to or higher than the cut-off voltage Ve. If "No" is determined, the process returns to Step S2 and the charging of the cells is continued.

Step S4: If "Yes" is determined in Step S3, the charging is stopped.

Step S5: Whether or not a voltage difference between the battery cells is equal to or lower than a threshold Vd is determined. A difference between a maximum voltage Vmax and a minimum voltage Vmin among the battery cells Ce1 to Ce3 is compared with the threshold Vd.

Step S6: If "Yes" is determined in Step S5, that is, if the difference between the maximum voltage Vmax and the minimum voltage Vmin is equal to or lower than the threshold Vd, the cell-balancing operation is not performed. Then, whether or not the battery cell voltage is equal to or higher than the cut-off voltage is determined.

Step S7: If "Yes" is determined, the charging is terminated. If "No" is determined, the process returns to Step S2 (measuring voltage of each battery cell).

Step S8: If "No" is determined in Step S5, That is, the difference between the maximum voltage Vmax and the minimum voltage Vmin is not equal to or lower than the threshold Vd, the cell-balancing operation is performed. The switches connected to the battery cell having the maximum voltage Vmax are turned on for a period Tb1. The current measurement circuit AMb measures a first balance current Ib1 flowing into the cell-balancing capacitance CB.

Step S9: The switches connected to the battery cell having the minimum voltage Vmin are turned on for a period Tb2. The current measurement circuit AMb measures a second balance current Ib2 flowing from the cell-balancing capacitance CB. Then, the process returns to Step S5 and whether or not the voltage difference between the battery cells is equal to or lower than the threshold Vd is determined. By repeating the processes of Steps S5, S8, and S9, the voltage difference between the battery cells is controlled to be equal to or lower than the threshold Vd.

Figure 3:
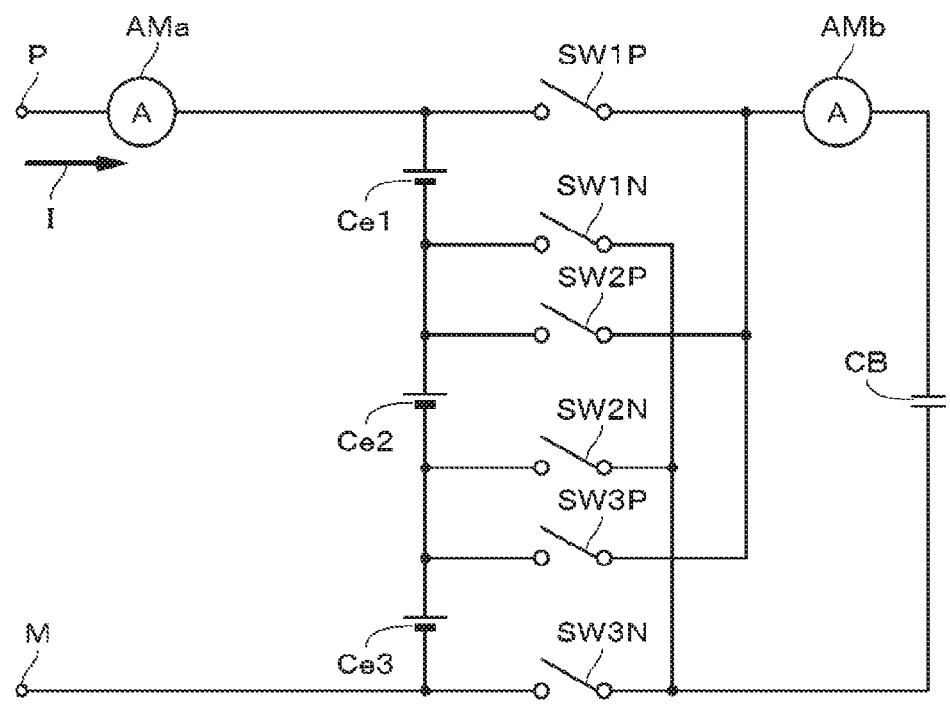
FIG. 3 A connection diagram showing main parts according to the first embodiment of the present disclosure.
Figure 4:
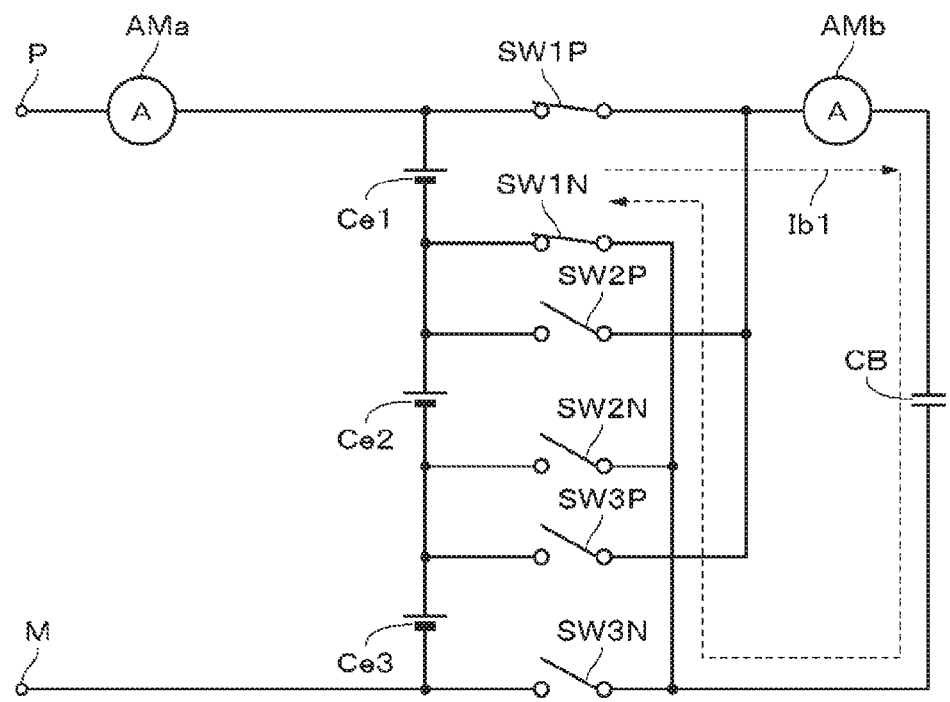
FIG. 4 A connection diagram for describing the first embodiment of the present disclosure.
Figure 5:
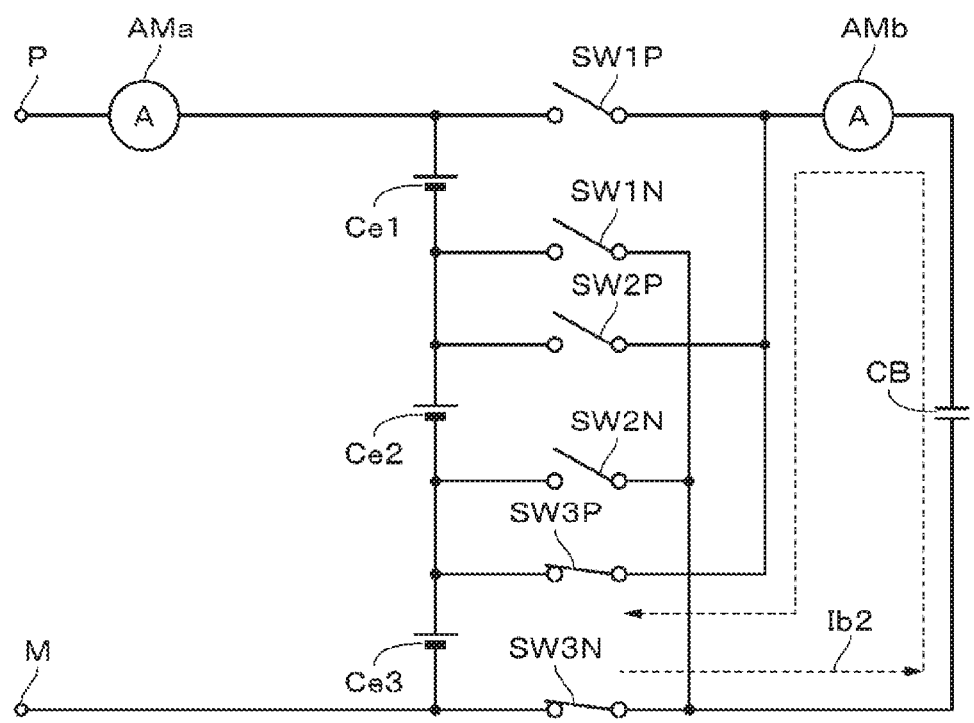
FIG. 5 A connection diagram for describing the first embodiment of the present disclosure.

Referring to FIGS. 3, 4, and 5, the first embodiment of the present disclosure will be further described. FIG. 3 shows connection of the main parts in the connection shown in FIG. 1. During normal operation, for example, charging, as shown in FIG. 3, all switches SW1P to SW3N are off and a module current I flows through the battery cells Ce1, Ce2, and Ce3. The module current I is measured by the current measurement circuit AMa. The measurement value is stored in the memory of the control unit CNT as digital data together with information on an operation state (e.g., information on ON/OFF-state of switches). Also in the processes to be described later, the measurement value of the current measurement circuit is stored in the memory together with the information on the operation state. Here, assuming that a time from the charging start to the cell-balancing operation start is denoted by Tm, the charging/discharging amounts (indicating charged/discharged charge amounts) Q1 to Q3 of the battery cells Ce1 to Ce3 can be expressed by the following Equation (1).

[Equation 1]

$$Qn = \int_0^{Tm} I\,dt \quad n=1\sim3 \qquad (1)$$

Here, the charging/discharging amounts of the cells before the cell-balancing start are $Q1=Q2=Q3$.

Here, if the battery cells Ce1 to Ce3 have a voltage difference due to capacity variations, initial charging amount variations, or the like of the battery cells Ce1 to Ce3 in the situation where the battery cells Ce1 to Ce3 are charged, the charging ends when a voltage of one battery cell reaches a charging termination condition. In view of this, a cell-balancing function is activated for overcoming voltage variations among the cells due to this uneven charging state.

As an example, it is assumed that the battery cell Ce1 is a maximum voltage and the battery cell Ce3 is a minimum voltage among the battery cells Ce1 to Ce3 and a voltage difference between the both is equal to or higher than the threshold. As shown in Step S8 of the flowchart of FIG. 2, SW1P and SW1N of the battery cell Ce1 are turned on for the period Tb1. This state is shown in FIG. 4.

As shown in FIG. 4, the battery cell Ce1 and the cell-balancing capacitance CB are connected in parallel. For a time before a voltage at the both ends of the cell-balancing capacitance CB becomes equal to a terminal voltage of the battery cell Ce1, the first balance current Ib1 flows into CB, following the course indicated by the broken line, and a balance current Ib1 is measured by the current measurement circuit AMb.

It is assumed that a period in which a current flows from the battery cell Ce1 to the cell-balancing capacitance CB is denoted by Tb1. After the period Tb1, as shown in FIG. 5, SW1P and SW1N are turned off and SW3P and SW3N are turned on. The second balance current Ib2 flows from the cell-balancing capacitance CB to the battery cell Ce3, following the course indicated by the broken line. This balance current Ib2 is measured by the current measurement circuit AMb. The balance current Ib2 flows until a terminal voltage of the cell-balancing capacitance CB equals a terminal voltage of the battery cell Ce3. It is assumed that this period is denoted by Tb2. Charging/discharging amounts of the battery cells Ce1 to Ce3 due to the series of operations up to this point are expressed by the following equations (2), (3), and (4).

[Equation 2]
$$Q1 = \int_0^{Tm} I dt - \int_{Period\ Tb1} Ib1 dt \qquad (2)$$

[Equation 3]
$$Q2 = \int_0^{Tm} I dt \qquad (3)$$

[Equation 4]
$$Q3 = \int_0^{Tm} I dt + \int_{Period\ Tb2} Ib2 dt \qquad (4)$$

The operations shown in FIGS. 4 and 5 are repeated until the terminal voltages of the battery cells Ce1 to Ce3 become equal or the difference between the maximum voltage and the minimum voltage among the battery cells Ce1 to Ce3 becomes equal to or lower than a certain value. The module current I is measured by the current measurement circuit AMa and a current flowing into the battery cells Ce1 to Ce3 during balancing is measured by the current measurement circuit AMb. Thus, regarding the charging state of the battery cells Ce1 to Ce3, the charging state of the battery cells Ce1 to Ce3 can be known using equations (1) to (4). In addition, with a total of two measurement circuits of one measurement circuit for measuring an entire current of the entire module and one measurement circuit for measuring a balance current flowing through each battery cell during balancing, the charging amount of each battery cell can be known. Therefore, in comparison with the conventional case of using current measurement circuits for each battery cell, fewer current measurement circuits can be provided. As described above, the capacity, degradation degree, etc. of each cell can be accurately estimated by using each cell voltage and each charging/discharging amount even if cell balancing is performed.

<2. Second Embodiment of Present Disclosure>

Figure 6:
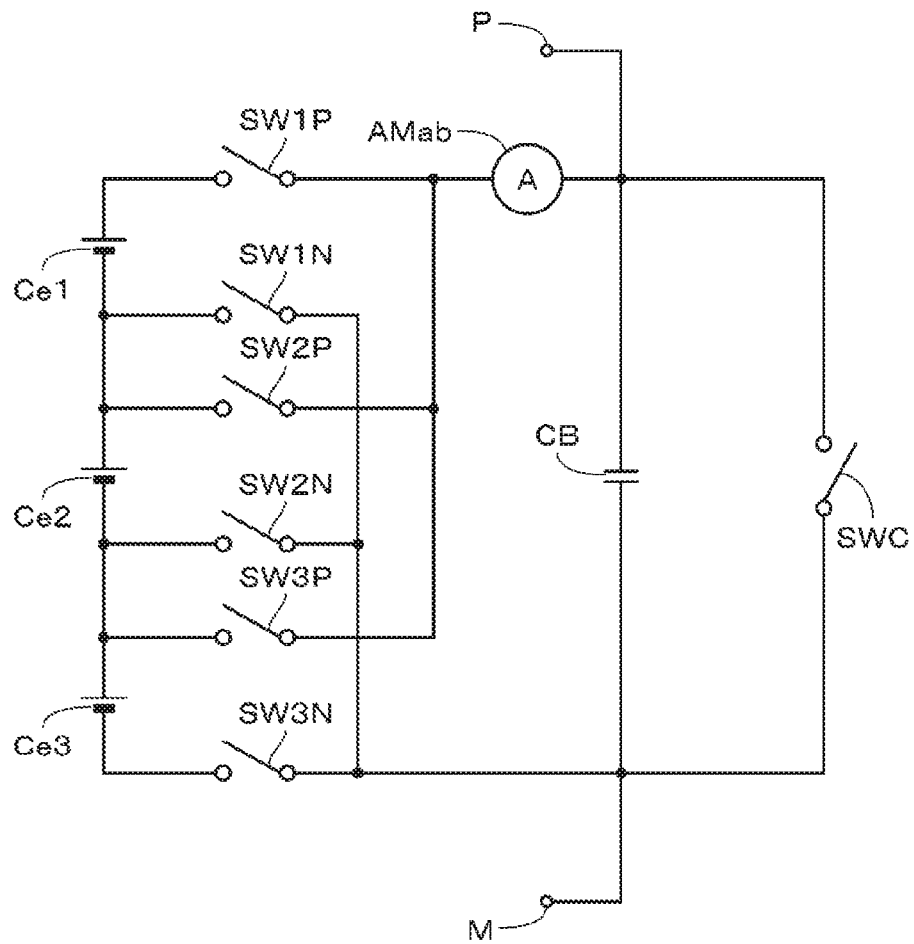
FIG. 6 A connection diagram showing main parts according to a second embodiment of the present disclosure.

Referring to FIGS. 6 to 9, a second embodiment of the present disclosure will be described. FIG. 6 shows configurations of the main parts according to the second embodiment. In the figure, portions corresponding to those of the above-mentioned first embodiment will be denoted by the same reference symbols. For example, battery cells Ce1, Ce2, and Ce3 of a lithium-ion secondary battery are connected in series.

A positive side of the series connection of the battery cells Ce1, Ce2, and Ce3 is connected to a module terminal P and one terminal of a cell-balancing capacitance CB via a current measurement circuit AMab. That is, the common current measurement circuit AMab is connected between the module terminal P and the battery cells Ce1 to Ce3. A negative side of the series connection of the battery cells is connected to a module terminal M and the other terminal of the cell-balancing capacitance CB. Semiconductor switching elements such as an FET and an IGBT are used for switches SW1P to SW3P and SW1N to SW3N.

The current measurement circuit AMab measures a module current and a balance current that flow through the series connection of the battery cells Ce1 to Ce3. A current measurement circuit or the like using a shunt resistance and a Hall element can be used as the current measurement circuit AMab. A charge reset switch SWC is connected in parallel to the cell-balancing capacitance CB. Preceding the cell-balancing control, the charge reset switch SWC is turned on.

With respect to the module terminals P and M, a charging circuit is connected thereto during charging and a load is connected thereto during discharging. Note that the battery cell may be replaced by a battery block in which a plurality of battery cells are connected in parallel. In addition, the number of battery cells or battery blocks connected in series can be any number other than three. Note that, although not shown in the figure, as in the first embodiment, there are provided a voltage measurement circuit that measures a voltage at both ends of each of the battery cells Ce1 to Ce3, a charging/discharging circuit that controls conduction of a charge/discharge current, a control unit that controls, based on information on a voltage, a current, and the like, the switches and the charging/discharging circuit, and the like. In addition, charging/discharging amounts of the battery cells that are obtained from data of the current values measured by the current measurement circuit AMab are stored in the memory of the control unit.

Figure 7:
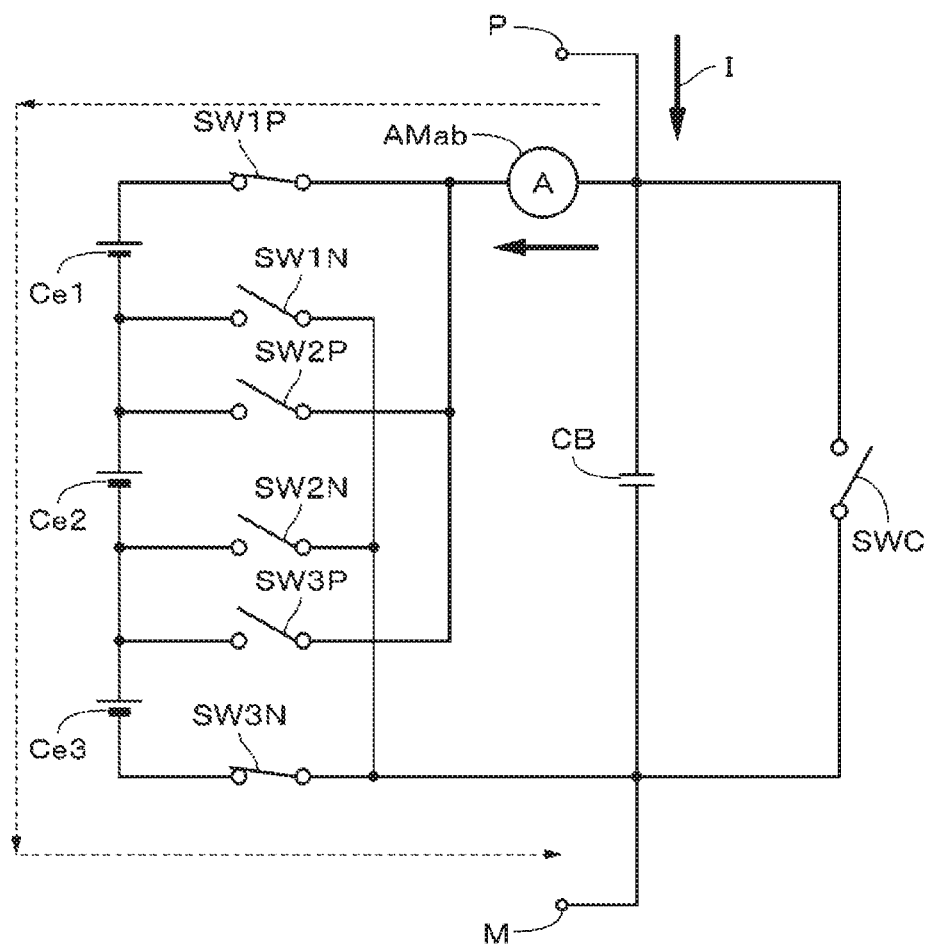
FIG. 7 A connection diagram for describing the second embodiment of the present disclosure.

As shown in FIG. 7, in a normal state, for example, a charging state, the switches SW1P and SW3N are in ON-state and the other switches are in OFF-state. In FIG. 7, a module current I, which is externally supplied, flows through the battery cells Ce1 to Ce3 connected in series, following the course indicated by the broken line. A current value thereof is measured by the current measurement circuit AMab. The measurement value is stored.

Figure 8:
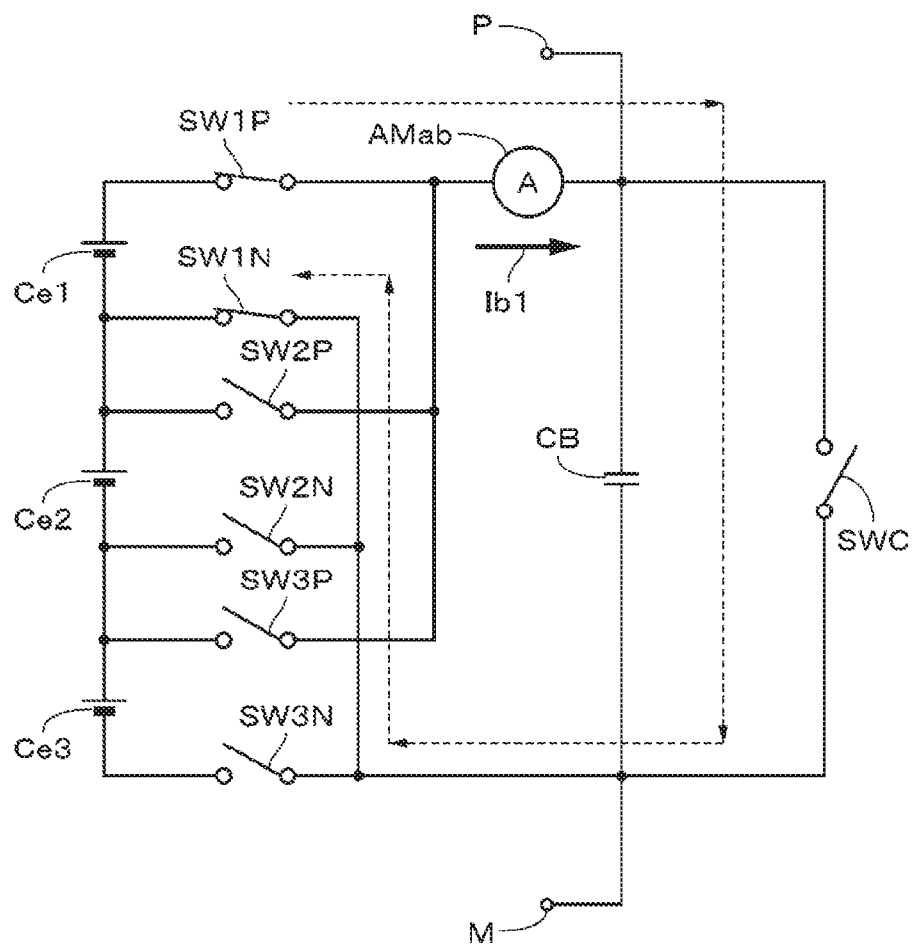
FIG. 8 A connection diagram for describing the second embodiment of the present disclosure.
Figure 9:
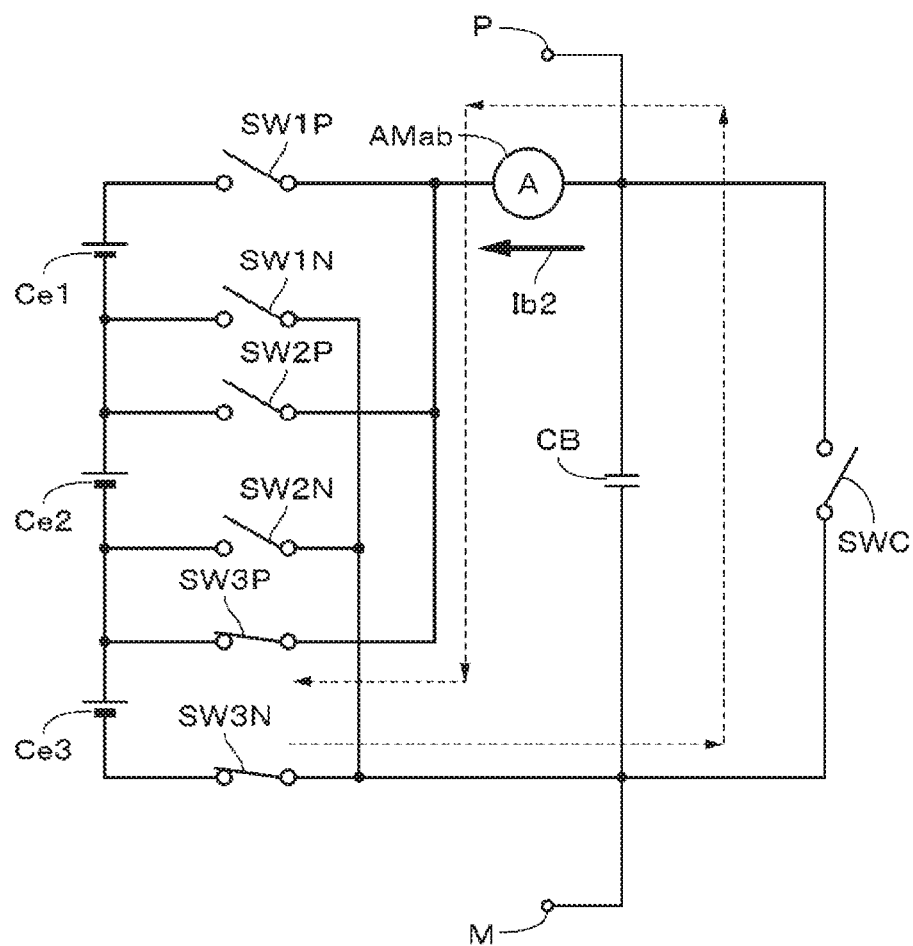
FIG. 9 A connection diagram for describing the second embodiment of the present disclosure.

FIGS. 8 and 9 show a cell-balancing state of the second embodiment. As an example, it is assumed that the battery cell Ce1 is a maximum voltage and the battery cell Ce3 is a minimum voltage among the battery cells Ce1 to Ce3. Once the cell-balancing operation starts, as shown in FIG. 8, the switches SW1P and SW1N are first turned on. Thus, the battery cell Ce1 and the cell-balancing capacitance CB are connected in parallel and the balance current Ib1 flows into the cell-balancing capacitance CB, following the course indicated by the broken line, for a time until a voltage at both ends of CB becomes equal to the terminal voltage of the battery cell Ce1. The balance current Ib1 is measured by the current measurement circuit AMab. The measurement value is stored.

After that, as shown in FIG. 9, the switches SW1P and SW1N are turned off and the switches SW3P and SW3N are turned on. A balance current Ib2 flows from the cell-balancing capacitance CB to the battery cell Ce3, following the course indicated by the broken line. This current is measured by the current measurement circuit AMab. In the second embodiment, as described above, the single current measurement circuit AMab is capable of measuring the module current I, the balance current Ib1, and the balance current Ib2. Therefore, as in the first embodiment, using Equations (1) to (4), the charging state of the battery cells Ce1 to Ce3 can be known.

In addition, measurement of a current of the entire module and measurement of a current flowing through each battery cell during balancing are performed by the single current measurement circuit AMab, and hence fewer current measurement circuits can be provided. As described above, the capacity, degradation degree, etc. of each cell can be accurately estimated by using each cell voltage and each charging/discharging amount even if cell balancing is performed. Using the single current measurement circuit AMab is advantageous in that it is possible to reduce not only the costs but also the influence of variations in the accuracy of the current measurement circuits.

<3. Third Embodiment of Present Disclosure>

Figure 10:
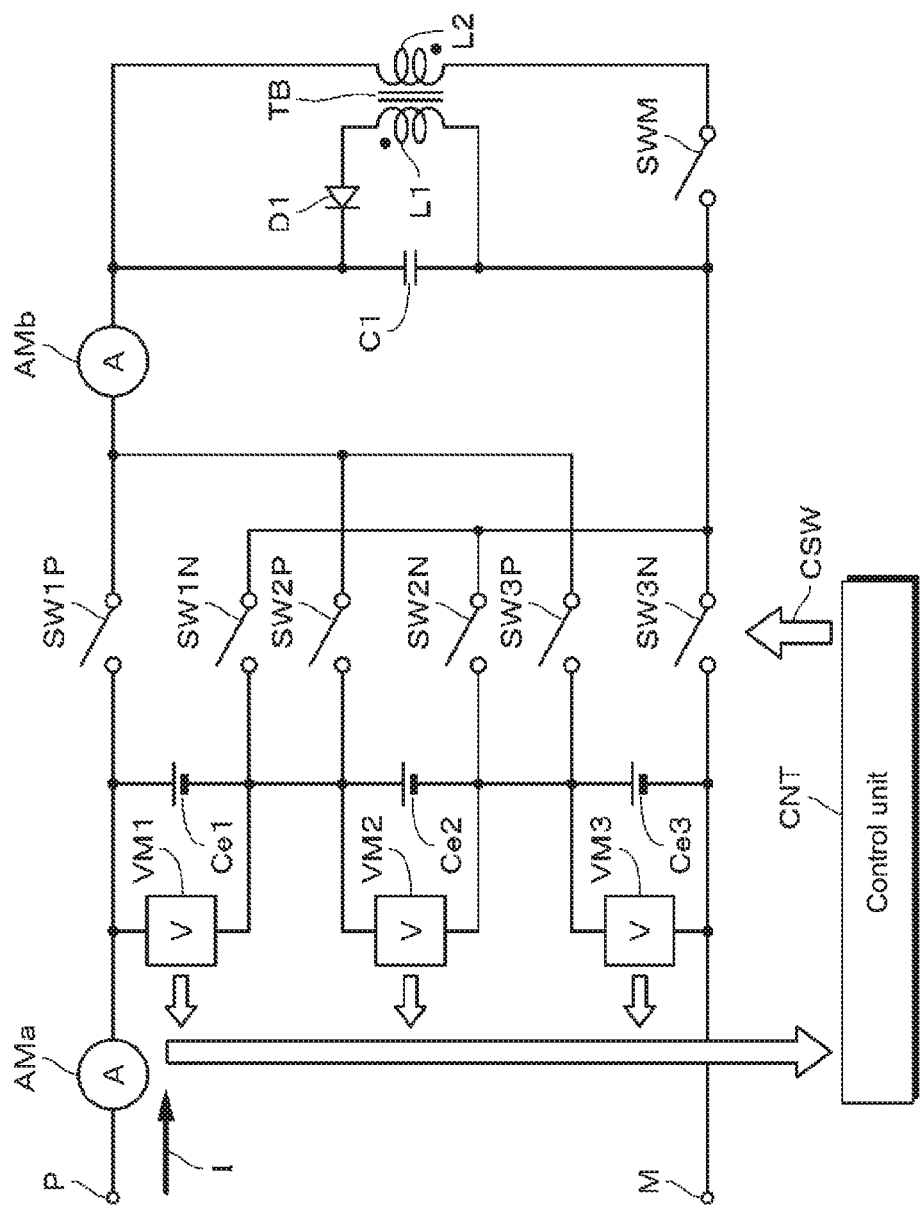
FIG. 10 A connection diagram showing a third embodiment of the present disclosure.
Figure 14:
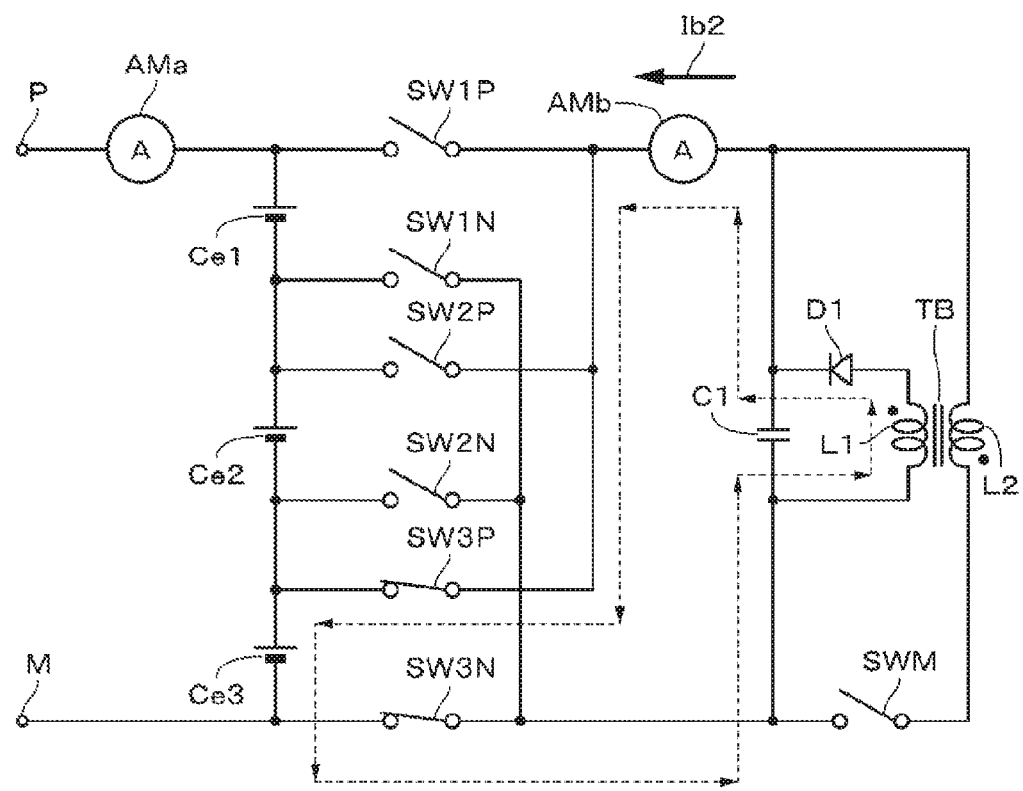
FIG. 14 A connection diagram for describing the third embodiment of the present disclosure.

Referring to FIGS. 10 and 14, a third embodiment of the present disclosure will be described. While each of the first and second embodiments uses the cell-balancing capacitance CB, the third embodiment uses a cell-balancing transformer TB.

For cell balancing, a positive side of each of battery cells Ce1 to Ce3 is connected to a winding end terminal of a secondary coil L2 of the cell-balancing transformer TB via switches SW1P, SW2P, and SW3P and a current measurement circuit AMb. Negative sides of the battery cells Ce1 to Ce3 are connected to a winding start terminal of the secondary coil L2 of the cell-balancing transformer TB via switches SW1N, SW2N, and SW3N and a common switch SWM. As in the switches SW1P to SW3P and SW1N to SW3N, a semiconductor switching element such as an FET and an IGBT is used for the switch SWM.

In addition, a winding start terminal of a primary coil L1 of the cell-balancing transformer TB is connected to one terminal of a capacitor C1 via a diode D1 in a forward direction and the other terminal of the capacitor C1 is connected to a winding end terminal of the primary coil L1. The diode D1 is connected for preventing a reverse current. In addition, a winding start terminal of the primary coil L1 is connected to the winding end terminal of the secondary coil L2 via the diode D1. A winding end terminal of the primary coil L1 is connected to a winding start terminal of the secondary coil L2 via the switch SWM. Polarities of the primary coil L1 and the secondary coil L2 are opposite.

Figure 11:
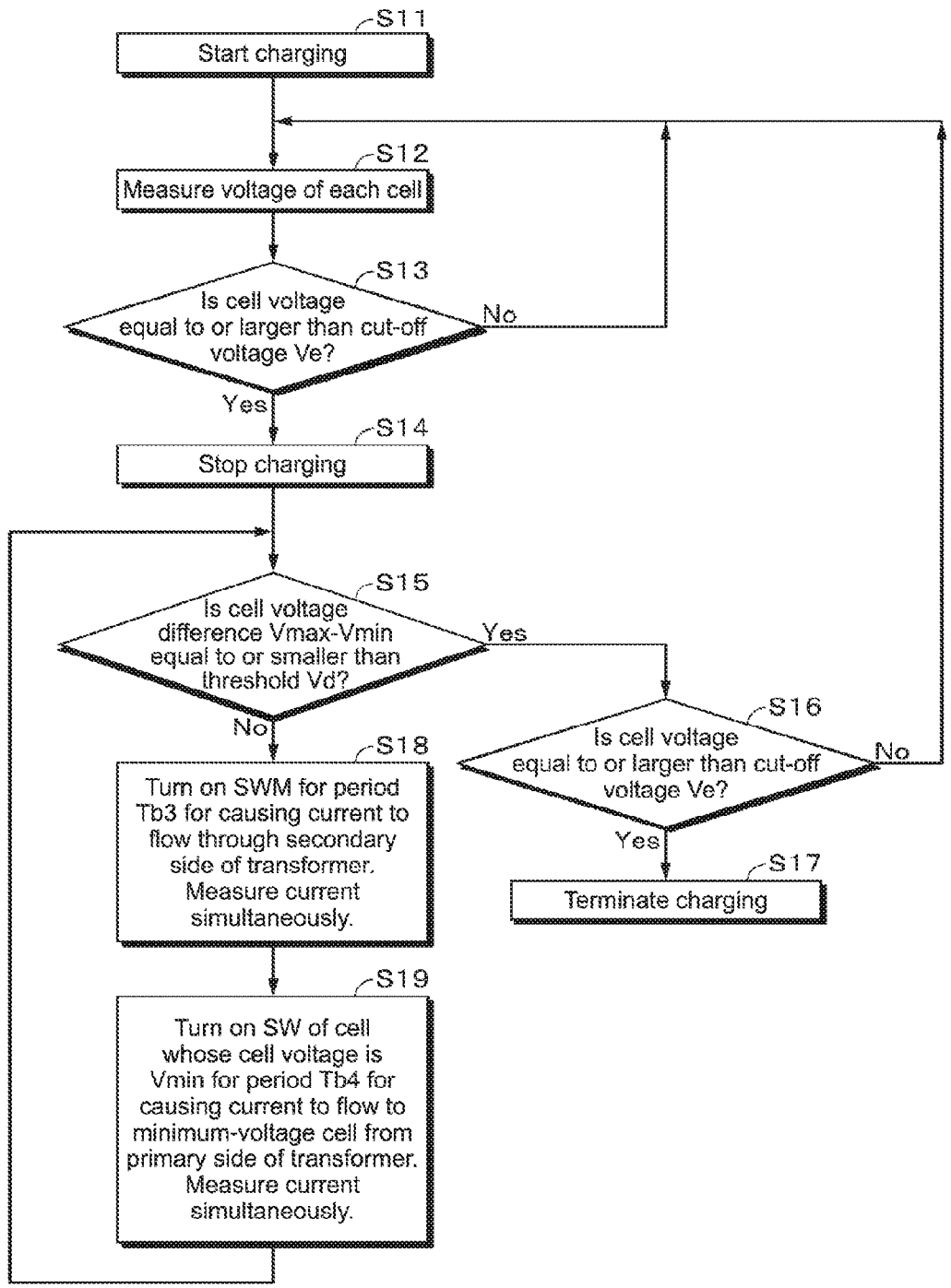
FIG. 11 A flowchart for describing the third embodiment of the present disclosure.

Referring to a flowchart of FIG. 11, a control example of the cell-balancing operation that is performed by the control unit CNT will be described. As compared with the flowchart of FIG. 2, the same processes are performed except for Steps S18 and S19.

It should be noted that, for easy understanding of the process flow, descriptions will be made in order.

Step S11: Charging is started.

Step S12: A voltage of each battery cell is measured.

Step S13: Whether or not a maximum voltage among the battery cells Ce1 to Ce3 is equal to or higher than the cut-off voltage Ve is determined. If "Not" is determined, the process returns to Step S12 and the charging of the cells is continued.

Step S14: If "Yes" is determined in Step S13, the charging is stopped.

Step S15: A difference between a maximum voltage Vmax and a minimum voltage Vmin among the battery cells Ce1 to Ce3 is compared with the threshold Vd.

Step S16: If the difference between the maximum voltage Vmax and the minimum voltage Vmin is equal to or lower than the threshold Vd, the cell-balancing operation is not performed. Then, whether or not the battery cell voltage is equal to or higher than the cut-off voltage is determined.

Step S17: If "Yes" is determined, the charging is terminated. If "No" is determined, the process returns to Step S12 (measuring voltage of each battery cell).

Step S18: If it is in Step S15 determined that the difference between the maximum voltage Vmax and the minimum voltage Vmin is not equal to or lower than the threshold Vd, the cell-balancing operation is performed. The switch SWM is turned on for a period Tb3 in which a current flows through the secondary coil L2 of the cell-balancing transformer TB. The current measurement circuit AMb measures the flowing current.

Step S19: The switches connected to the battery cell having the minimum voltage Vmin are turned on for a period Tb4 and the battery cell is supplied with a current from the primary coil L1. The current measurement circuit AMb measures a current supplied from the primary coil L1. Then, the process returns to Step S15 and whether or not a voltage difference between the battery cells is equal to or lower than the threshold Vd is determined. By repeating the processes of Steps S15, S18, and S19, the voltage difference between the battery cells is controlled to be equal to or lower than the threshold Vd.

Figure 12:
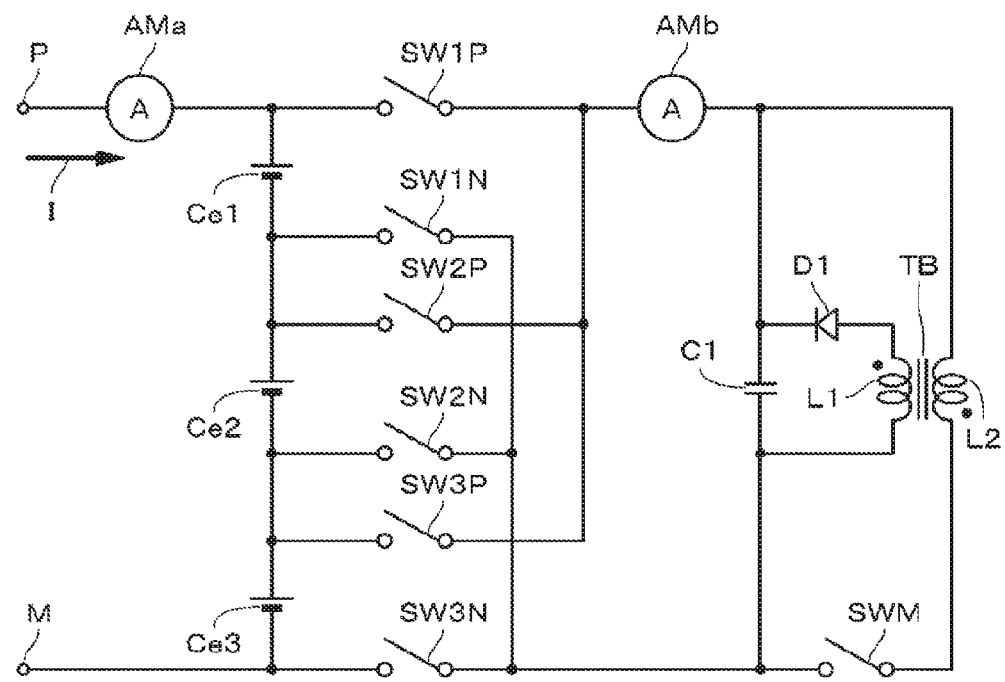
FIG. 12 A connection diagram showing main parts according to the third embodiment of the present disclosure.
Figure 13:
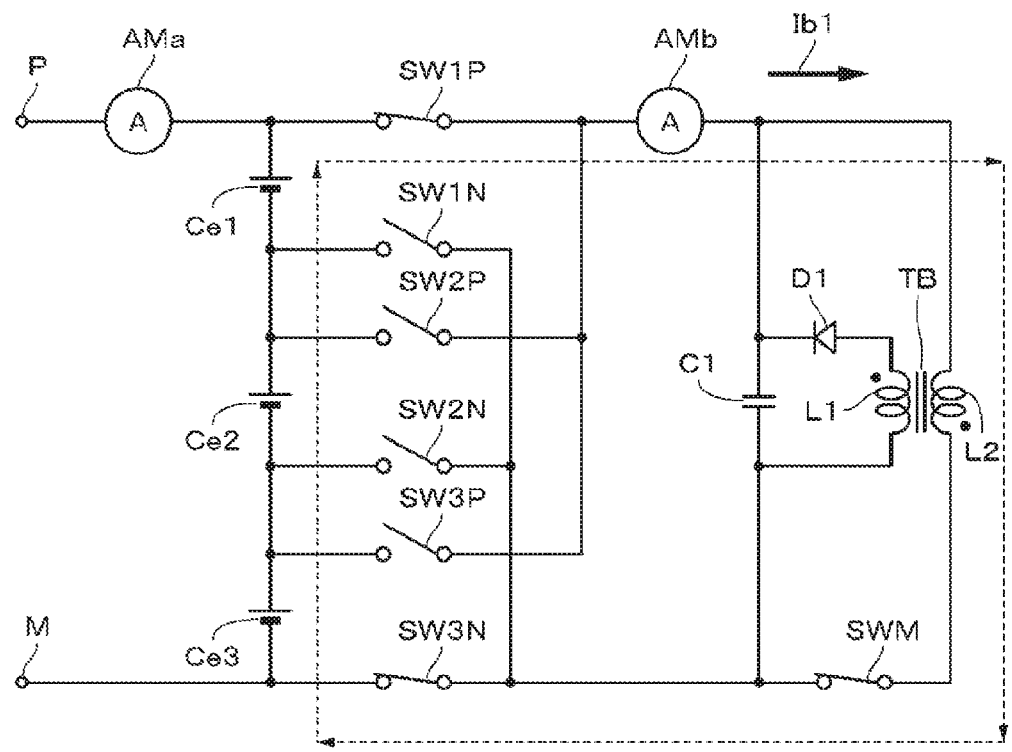
FIG. 13 A connection diagram for describing the third embodiment of the present disclosure.

Referring to FIGS. 12, 13, and 14, the third embodiment of the present disclosure will be further described. FIG. 12 shows connection of the main parts in the connection shown in FIG. 10. During normal operation, for example, charging, as shown in FIG. 12, all switches SW1P to SW3N and the switch SWM are off and a module current I flows through the battery cells Ce1, Ce2, and Ce3. The module current I is measured by the current measurement circuit AMa. The measurement value is stored in the memory of the control unit CNT as digital data together with information on an operation state (e.g., information on ON/OFF-state of switches). Also in the processes to be described later, the measurement value of the current measurement circuit is stored in the memory together with the information on the operation state. Here, assuming that a time from the charging start to the cell-balancing operation start is denoted by Tm, the charging/discharging amount (charged/discharged charge amount) Q1 to Q3 of the battery cells Ce1 to Ce3 can be expressed by Equation (1) described above.

Here, the charging/discharging amounts of the cells before the cell-balancing start are Q1-Q2-Q3.

Here, if the battery cells Ce1 to Ce3 have a voltage difference due to capacity variations, initial charging amount variations, or the like of the battery cells Ce1 to Ce3 in the situation where the battery cells Ce1 to Ce3 are charged, the charging ends when a voltage of one battery cell reaches a charging termination condition. In view of this, a cell-balancing function is activated for overcoming voltage variations among the cells due to this uneven charging state.

As an example, it is assumed that the battery cell Ce1 is a maximum voltage and the battery cell Ce3 is a minimum voltage among the battery cells Ce1 to Ce3 and a voltage difference between the both is equal to or higher than the threshold. As shown in Step S18 of the flowchart of FIG. 11, the switches SW1P, SWM, and SW3N are first turned on for the period Tb3. This state is shown in FIG. 13. The first balance current Ib1 flows through a secondary side of the cell-balancing transformer TB, following the course indicated by the broken line. At this time, charging amounts with respect to the battery cells Ce1 to Ce3 are expressed by the following Equation (5). This current is measured by the current measurement circuit AMb.

[Equation 5]
$$Q1 = Q2 = Q3 = \int_{0}^{Tm} Idt - \int_{Period\ Tb3} Ib1dt \quad (5)$$

Next, the state is switched and, as shown in FIG. 14, the switches SW3P and SW3N are turned on and the switch SWM is turned off in the period Tb4. In the period Tb3, energy stored by energizing the secondary side of the cell-balancing transformer TB is discharged on the primary side as electric energy and the battery cell Ce3 is charged with the balance current Ib2. The second balance current Ib2 is measured by the current measurement circuit AMb. Charging amounts of the cells at this time are expressed by the following Equations (6) and (7).

[Equation 6]
$$Q1 = Q2 = \int_{0}^{Tm} Idt - \int Ib1dt \quad (6)$$

[Equation 7]
$$Q3 = \int_{0}^{Tm} Idt - \int_{Period\ Tb3} Ib1dt + \int_{Period\ Tb4} Ib2dt \quad (7)$$

The above-mentioned operations shown in FIGS. 13 and 14 are repeated until the terminal voltages of the battery cells Ce1 to Ce3 become equal or the difference between the maximum voltage and the minimum voltage among the battery cells Ce1 to Ce3 becomes equal to or lower than a certain value. The module current I is measured by the current measurement circuit AMa. The balance current flowing through the battery cells Ce1 to Ce3 during balancing is measured by the current measurement circuit AMb. Therefore, regarding the charging state of the battery cells Ce1 to Ce3, the charging state of the battery cells Ce1 to Ce3 can be known using Equations (1), (5), (6), and (7).

In addition, with a total of two measurement circuits of one measurement circuit for measuring an entire current of the entire module and one measurement circuit for measuring a balance current flowing through each battery cell during balancing, the charging amount of each battery cell can be known. Therefore, in comparison with the conventional case of using current measurement circuits for each battery cell, fewer current measurement circuits can be provided. As described above, the capacity, degradation degree, etc. of each cell can be accurately estimated by using each cell voltage and each charging/discharging amount even if cell balancing is performed.

<4. Fourth Embodiment of Present Disclosure>

Figure 15:
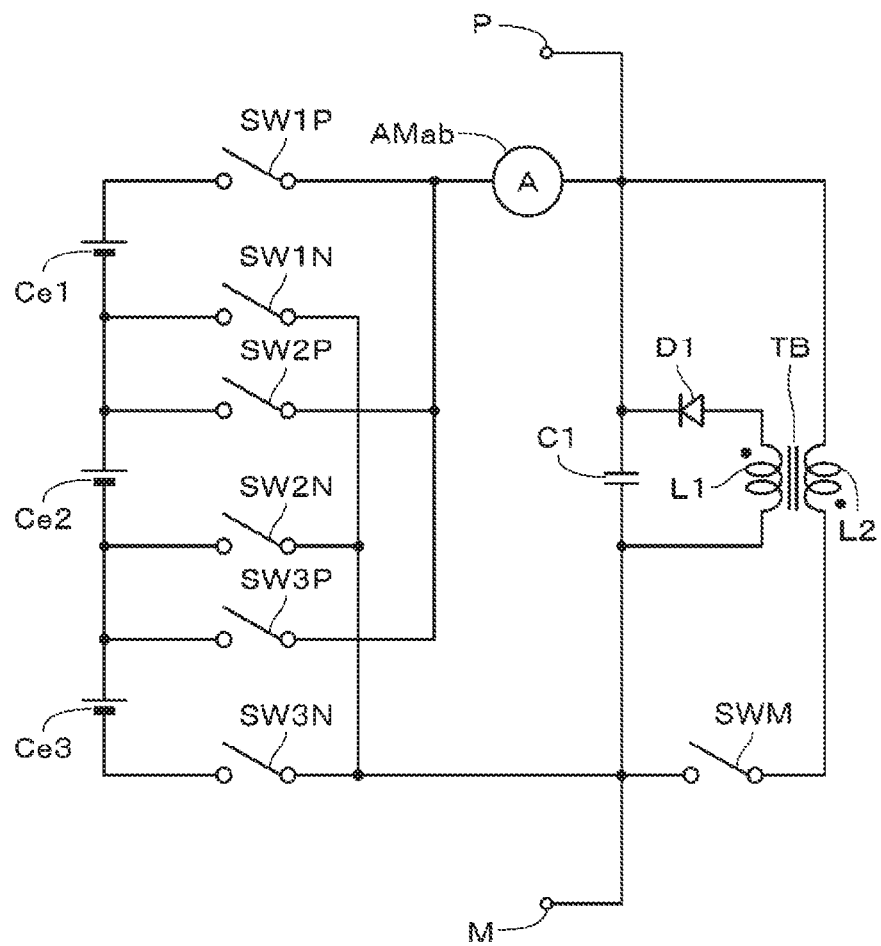
FIG. 15 A connection diagram showing the main parts according to the fourth embodiment of the present disclosure.

Referring to FIGS. 15 to 18, a fourth embodiment of the present disclosure will be described. The fourth embodiment uses, as in the third embodiment, the cell-balancing transformer TB. FIG. 15 shows configurations of the main parts of the fourth embodiment and portions corresponding to those of the above-mentioned third embodiment will be denoted by the same reference symbols. For example, battery cells Ce1, Ce2, and Ce3 of a lithium-ion secondary battery are connected in series.

For cell balancing, positive sides of the battery cells Ce1 to Ce3 are connected to a winding end terminal of the secondary coil L2 of the cell-balancing transformer TB via the switches SW1P, SW2P, and SW3P and the current measurement circuit AMab. Negative sides of the battery cells Ce1 to Ce3 are connected to a winding start terminal of the secondary coil L2 of the cell-balancing transformer TB via the switches SW1N, SW2N, and SW3N and the common switch SWM. As in the switches SW1P to SW3P and SW1N to SW3N, a semiconductor switching element such as an FET and an IGBT is used for the switch SWM.

In addition, a winding start terminal of the primary coil L1 of the cell-balancing transformer TB is connected to one terminal of the capacitor C1 via the diode D1 in a forward direction. The other terminal of the capacitor C1 is connected to the winding end terminal of the primary coil L1. In addition, the winding start terminal of the primary coil L1 is connected to the winding end terminal of the secondary coil L2 via the diode D1. The winding end terminal of the primary coil L1 is connected to a winding start terminal of the secondary coil L2 via the switch SWM. Polarities of the primary coil L1 and the secondary coil L2 are opposite.

A connection point between the current measurement circuit AMab and the winding end terminal of the secondary coil L2 is derived as the module terminal P. A connection point between a common connection point of the switches SW1N to SW3N and the switch SWM is derived as the module terminal M.

Figure 16:
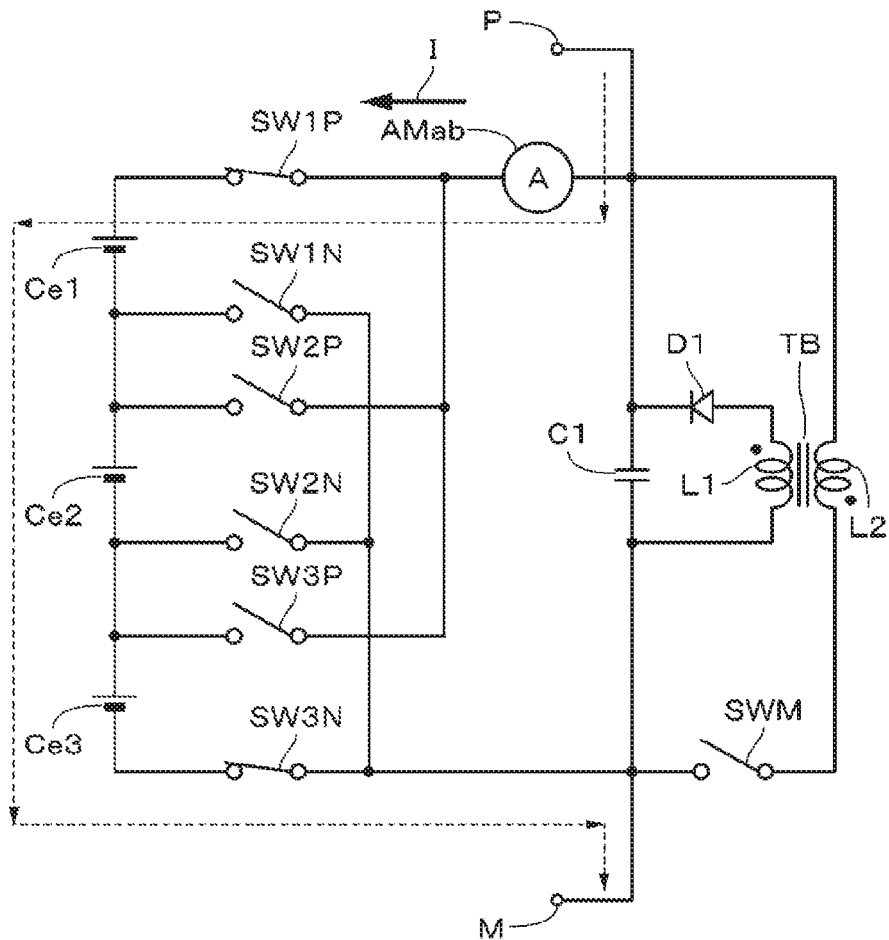
FIG. 16 A connection diagram for describing a fourth embodiment of the present disclosure.

During normal operation, for example, charging, as shown in FIG. 16, all switches SW1P to SW3N and the switch SWM are off and a module current I flows through the battery cells Ce1, Ce2, and Ce3. The module current I is measured by the current measurement circuit AMab. The measurement value is stored in the memory of the control unit CNT as digital data together with information on an operation state (e.g., information on ON/OFF-state of switches). Also in the processes to be described later, the measurement value of the current measurement circuit is stored in the memory together with the information on the operation state. Here, assuming that a time from the charging start to the cell-balancing operation start is denoted by Tm, the charging/discharging amount (charged/discharged charge amount) Q1 to Q3 of the battery cells Ce1 to Ce3 can be expressed by Equation (1) described above.

Here, the charging/discharging amounts of the cells before the cell-balancing start are Q1=Q2=Q3.

Here, if the battery cells Ce1 to Ce3 have a voltage difference due to capacity variations, initial charging amount variations, or the like of the battery cells Ce1 to Ce3 in the situation where the battery cells Ce1 to Ce3 are charged, the charging ends when a voltage of one battery cell reaches a charging termination condition. In view of this, a cell-balancing function is activated for overcoming voltage variations among the cells due to this uneven charging state.

Figure 17:
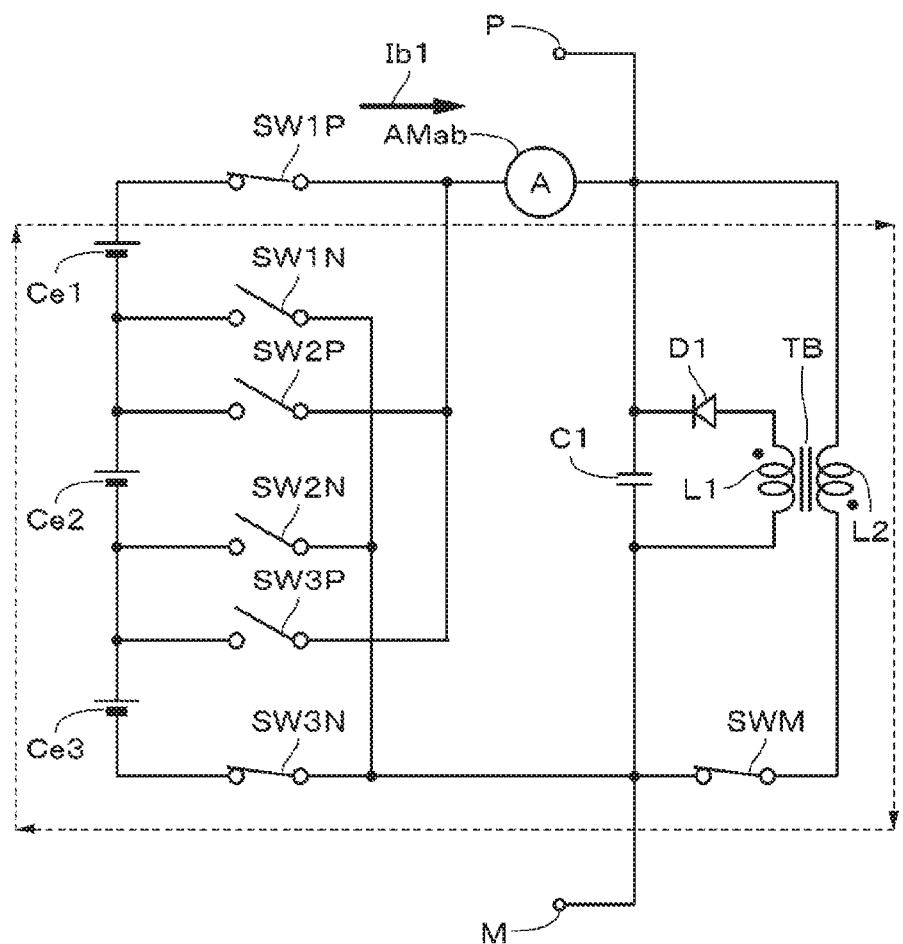
FIG. 17 A connection diagram for describing the fourth embodiment of the present disclosure.

As an example, it is assumed that the battery cell Ce1 is a maximum voltage and the battery cell Ce3 is a minimum voltage among the battery cells Ce1 to Ce3 and a voltage difference between the both is equal to or higher than the threshold. The switches SW1P, SWM, and SW3N are first turned on for the period Tb3. This state is shown in FIG. 17. The first balance current Ib1 flows through a secondary side of the cell-balancing transformer TB, following the course indicated by the broken line. At this time, charging amounts with respect to the battery cells Ce1 to Ce3 are expressed by Equation (5) described above. This current is measured by the current measurement circuit AMab.

Figure 18:
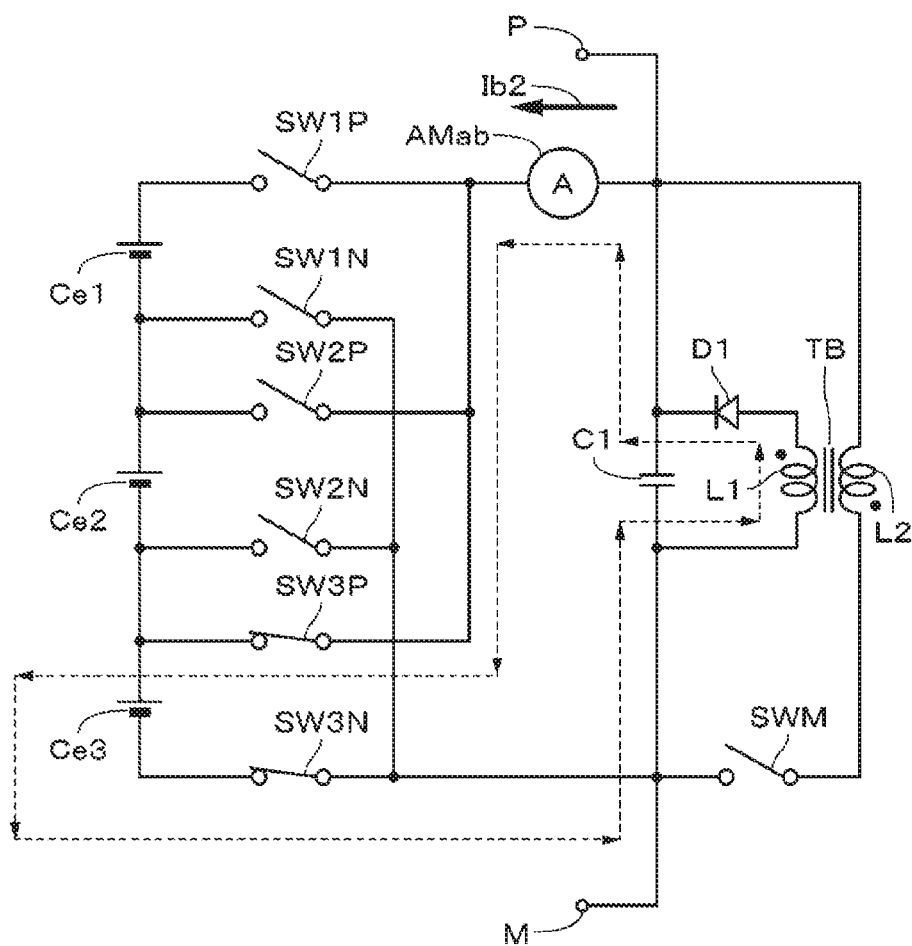
FIG. 18 A connection diagram for describing the fourth embodiment of the present disclosure.

Next, the state is switched and, as shown in FIG. 18, the switches SW3P and SW3N are turned on and the switch SWM is turned off in the period Tb4. In the period Tb3, energy stored by energizing the secondary side of the cell-balancing transformer TB is discharged on the primary side as electric energy and the battery cell Ce3 is charged with the balance current Ib2. The balance current Ib2 is measured by the current measurement circuit AMab. Charging amounts of the cells at this time are expressed by Equations (6) and (7) described above.

The operations shown in FIGS. 17 and 18 are, as in the third embodiment, repeated until the terminal voltages of the battery cells Ce1 to Ce3 become equal or the difference between the maximum voltage and the minimum voltage among the battery cells Ce1 to Ce3 becomes equal to or lower than a certain value. The module current I and the balance current flowing through the battery cells Ce1 to Ce3 during balancing are measured by the current measurement circuit AMab. Therefore, regarding the charging state of the battery cells Ce1 to Ce3, the charging state of the battery cells Ce1 to Ce3 can be known using Equations (1), (5), (6), and (7).

In addition, measurement for a current of the entire module and measurement for a current flowing through each battery cell during balancing are performed by the single current measurement circuit AMab. Therefore, fewer current measurement circuits can be provided. As described above, the capacity, degradation degree, etc. of each cell can be accurately estimated by using each cell voltage and each charging/discharging amount even if cell balancing is performed. Using the single current measurement circuit AMab is advantageous in that it is possible to reduce not only the costs but also the influence of variations in the accuracy of the current measurement circuits.

Each of the first to fourth embodiments of the present disclosure includes, in the power storage module including the cell-balancing circuit connected in parallel in a time division manner, the circuit that measures the current of the entire module and the one or no circuits that measure the charge/discharge currents of the secondary batteries. According to the first to fourth embodiments of the present disclosure, the charging/discharging amounts of the battery cells that are connected in series for configuring the power storage module can be accurately obtained without increasing the costs. It becomes possible to accurately measure the charging/discharging amount of each cell. Therefore, it becomes possible to grasp or more accurately estimate the charging state and deterioration state of the batteries.

<5. Application Example>
"Power Storage System in House as Application Example"

Figure 19:
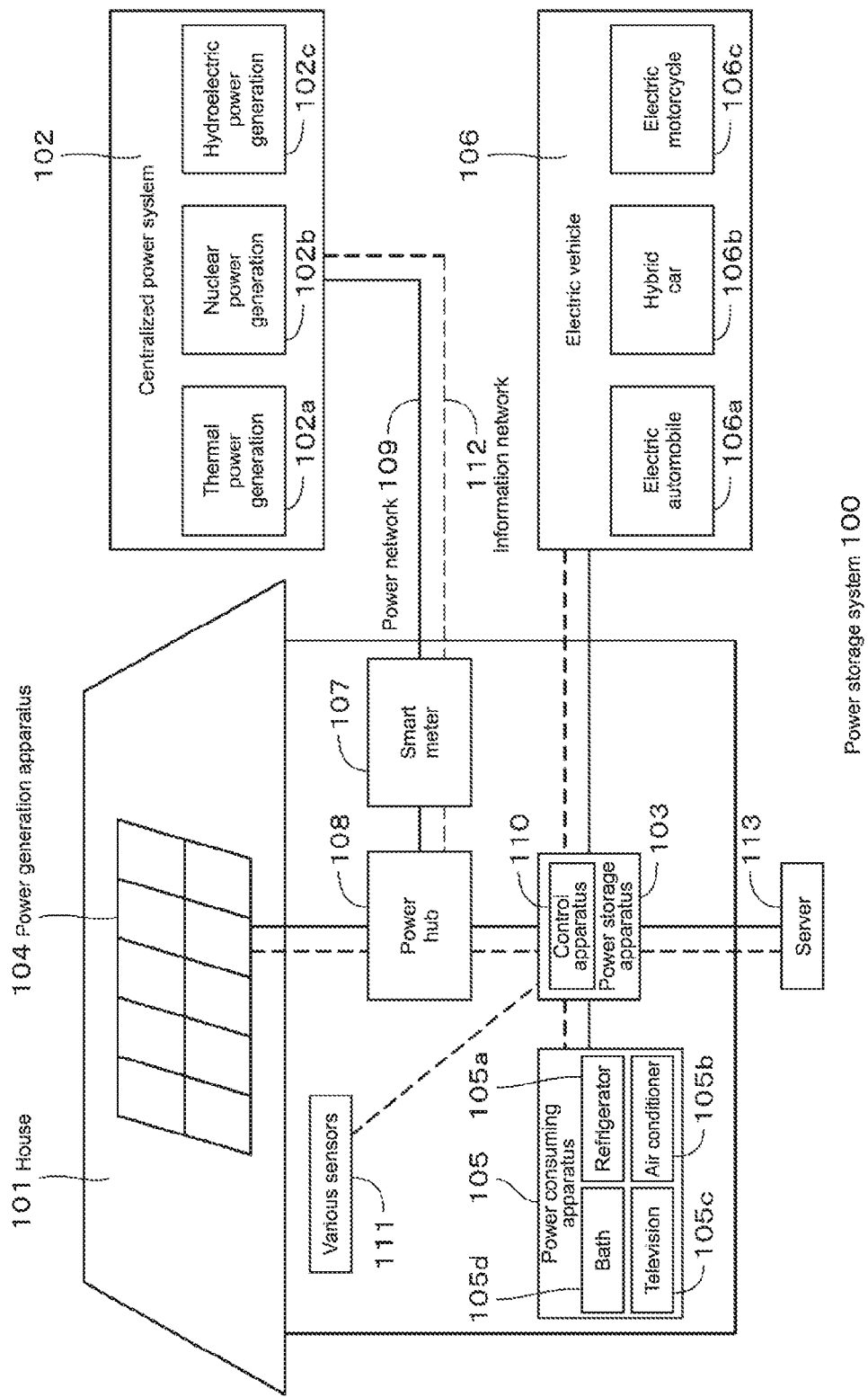
FIG. 19 A block diagram for describing an example of an application example of the present disclosure.

An example in which the present disclosure is applied to a power storage system for a house will be described referring to FIG. 19. For example, in a power storage system 100 for a house 101, power is supplied from a centralized power system 102 such as a thermal power generation 102a, a nuclear power generation 102b, and a hydroelectric power generation 102c to a power storage apparatus 103 via a power network 109, an information network 112, a smart meter 107, a power hub 108, or the like. Along with this, power is supplied from an independent power supply such as a private power generation apparatus 104 to the power storage apparatus 103. The power supplied to the power storage apparatus 103 is stored. Using the power storage apparatus 103, the power to be used in the house 101 is supplied. It is not limited to the house 101, a similar power storage system can also be used in a building.

In the house 101, provided are the power generation apparatus 104, a power consuming apparatus 105, the power storage apparatus 103, a control apparatus 110 that controls the respective apparatuses, the smart meter 107, and sensors 111 that obtain various types of information. The respective apparatuses are connected through the power network 109 and the information network 112. A solar battery, a fuel battery, or the like is used as the power generation apparatus 104. The generated power is supplied to the power consuming apparatus 105 and/or the power storage apparatus 103. The power consuming apparatus 105 is a refrigerator 105a, an air conditioner apparatus 105b, a television receiver 105c, a bath 105d, or the like. In addition, the power consuming apparatus 105 includes an electric vehicle 106. The electric vehicle 106 is an electric automobile 106a, a hybrid car 106b, or an electric motorcycle 106c.

The above-mentioned power supply apparatus of the present disclosure is applied to the power storage apparatus 103. The power storage apparatus 103 is constituted of a secondary battery or a capacitor. For example, it is constituted of a lithium-ion secondary battery. The lithium-ion secondary battery may be a stationary type or may be used in the electric vehicle 106. The smart meter 107 functions to measure a commercial-power consumption and transmit the measured consumption to a power company. Regarding the power network 109, one or more of a direct-current power supply, an alternate-current power supply, and a non-contact power supply may be combined.

The various sensors 111 are, for example, a person sensor, an illuminance sensor, an object detection sensor, a power consumption sensor, a vibration sensor, a contact sensor, a temperature sensor, and an infrared ray sensor. Information obtained by the various sensors 111 is transmitted to the control apparatus 110. From the information from the sensors 111, a weather state, a person state, and the like can be known and the power consuming apparatus 105 can be automatically controlled to minimize the energy consumption. In addition, the control apparatus 110 is capable of transmitting information on the house 101 to the external power company or the like via the Internet.

Processing such as branching of the power line and DC-AC conversion is performed by the power hub 108. As a communication method of the information network 112 connected to the control apparatus 110, there are a method of using a communication interface such as UART (Universal Asynchronous Receiver-Transceiver) and a method of using a sensor network according to wireless communication standards such as Bluetooth (registered trademark), ZigBee, and Wi-Fi. The Bluetooth (registered trademark) system is applied to multimedia communication and can perform one-to-many connection communication. The ZigBee uses a physical layer of IEEE (Institute of Electrical and Electronics Engineers) 802.15.4. The IEEE802.15.4 is a name of a short-distance wireless network standard called PAN (Personal Area Network) or W (Wireless) PAN.

The control apparatus 110 is connected to an external server 113. This server 113 may be managed by any of the house 101, the power company, and a service provider. Information transmitted and received by the server 113 are, for example, power consumption information, life pattern information, power charges, weather information, disaster information, and information on power transaction. Such information may be transmitted and received from the power consuming apparatus (e.g., television receiver) inside the house. Alternatively, the information may be transmitted and received from an apparatus (e.g., cellular phone) outside the house. The information may be displayed by a device having a display function, for example, the television receiver, the cellular phone, or PDA (Personal Digital Assistants).

The control apparatus 110 that controls the respective sections is constituted of a CPU (Central Processing Unit), a RAM (Random Access Memory), a ROM (Read Only Memory), and the like and housed in the power storage system 103 in this example. The control apparatus 110 is connected to the power storage system 103, the private power generation apparatus 104, the power consuming apparatus 105, the various sensors 111, and the server 113 via the information network 112. The control apparatus 110 functions to adjust the commercial-power consumption and a power generation amount, for example. Note that it also functions to perform power transaction in a power market, for example.

As described above, regarding the power, the generated power of the centralized power system 102 such as the thermal power generation 102a, the nuclear power generation 102b, and the hydroelectric power generation 102c as well as the generated power of the private power generation apparatus 104 (solar power generation, wind power generation) can be stored in the power storage system 103. Therefore, even if the generated power of the private power generation apparatus 104 fluctuates, it is possible to perform control to make an externally transmitted power amount constant or discharge a required amount of power. For example, the following usage is possible. Specifically, power obtained by solar power generation is stored in the power storage system 103 and inexpensive midnight power is stored in the power storage system 103 during night time and the power stored by the power storage system 103 is discharged and used during daytime when power charges are expensive.

Although, in the above example, the control apparatus 110 is housed in the power storage system 103, it may be housed in the smart meter 107 or may be configured without the housing. In addition, the power storage system 100 may be used for a plurality of households in an apartment house or may be used for a plurality of detached houses.

"Power Storage System in Vehicle as Application Example"

Figure 20:
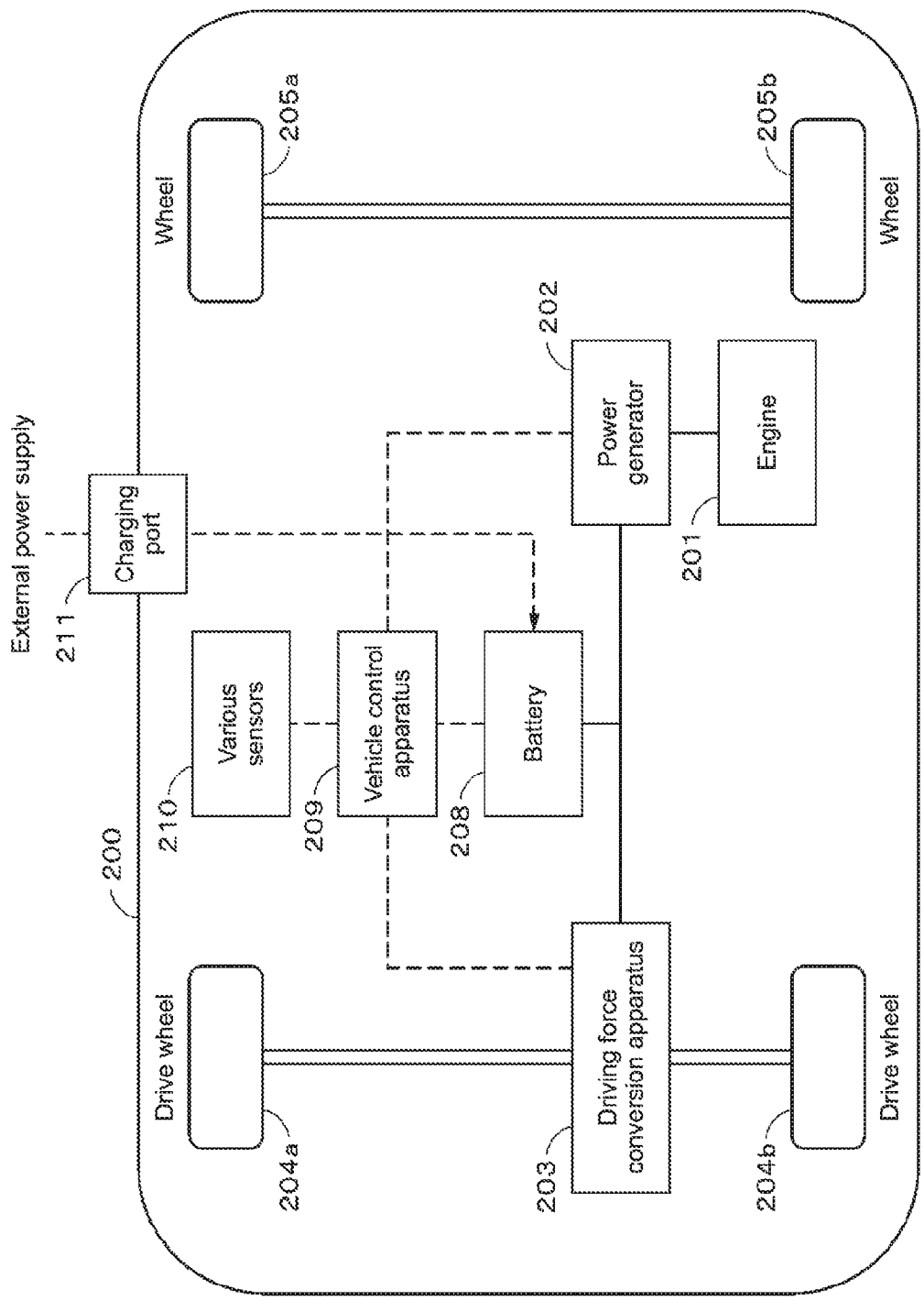
FIG. 20 A block diagram for describing another example of the application example of the present disclosure.

An example in which the present disclosure is applied to a power storage system for a vehicle will be described with reference to FIG. 20. FIG. 20 schematically shows an example of a configuration of a hybrid vehicle employing a series hybrid system to which the present disclosure is applied. The series hybrid system is an automobile that runs by an electric power/driving force conversion apparatus using power generated by a power generator driven by an engine or the power stored in a battery.

In this hybrid vehicle 200, an engine 201, a power generator 202, an electric power/driving force conversion apparatus 203, a drive wheel 204a, a drive wheel 204b, a wheel 205a, a wheel 205b, a battery 208, a vehicle control apparatus 209, various sensors 210, and a charging port 211 are installed. The above-mentioned power storage apparatus of the present disclosure is applied to the battery 208.

The hybrid vehicle 200 runs by using the electric power/driving force conversion apparatus 203 as a power source. An example of the electric power/driving force conversion apparatus 203 is a motor. The electric power/driving force conversion apparatus 203 is activated by power of the battery 208 and rotational force of this electric power/driving force conversion apparatus 203 is transmitted to the drive wheels 204a and 204b. Note that, by using direct current-alternate current (DC-AC) or inverse conversion (AC-DC conversion) at a necessary point, the electric power/driving force conversion apparatus 203 is applicable to both of an alternate-current motor and a direct-current motor. The various sensors 210 control the r.p.m. of the engine via the vehicle control apparatus 209 and control throttle valve opening (throttle opening) (not shown). The various sensors 210 include a speed sensor, an acceleration sensor, an engine r.p.m. sensor, and the like.

The rotational force of the engine 201 is transmitted to the power generator 202 and power generated by the power generator 202 can be stored in the battery 208 by the rotational force.

When the hybrid vehicle is decelerated by a braking mechanism (not shown), a resistance when the speed is reduced is added to the electric power/driving force conversion apparatus 203 as the rotational force. Then, regenerative power generated from this rotational force by the electric power/driving force conversion apparatus 203 is stored in the battery 208.

By the battery 208 being connected to the power supply outside the hybrid vehicle, it is also possible to receive a power supplied from an external power supply thereof with the charging port 211 being an input port and accumulate the received power.

Although not shown in the figure, an information processing apparatus that performs information processing relating to vehicle control based on information on a secondary battery may also be provided. As this information processing apparatus, for example, information processing apparatus or the like that displays a remaining capacity of a battery based on information on the remaining capacity of the battery.

Note that the series hybrid vehicle that runs by the motor using the power generated by the power generator driven by the engine or the power stored in the battery has been described as an example. However, the present disclosure is effectively applicable also to a parallel hybrid vehicle that sets both outputs of the engine and the motor as driving sources and appropriately switches and uses three modes of running only by the engine, running only by the motor, and running by the engine and the motor. In addition, the present disclosure is effectively applicable also to a so-called electric vehicle that is driven only by a driving motor without the engine for running.

>6. Modified Example>

Although the embodiments of the present disclosure have been specifically described hereinabove, the present disclosure is not limited to each of the above-mentioned embodiments and various modifications can be made based on the technical ideas of the present disclosure. For example, the configurations, methods, processes, shapes, materials, and numerical values, etc. shown in the above-mentioned embodiments are merely examples and other configurations, methods, processes, shapes, materials, and numerical values, etc. may be used depending on needs.

For example, each of the battery cells Ce1, Ce2, and Ce3 may be a battery block in which a plurality of battery cells are connected in parallel. Furthermore, it may be a power storage module in which a plurality of battery blocks are connected.

Note that the present disclosure may also take the following configurations.

(1) A power storage apparatus, including:
a battery section in which a plurality of power storage element sections each including at least one power storage element are connected in series;
a cell-balancing circuit that is connected in parallel to the plurality of power storage element sections and performs a cell-balancing operation between the plurality of power storage element sections;
a control unit that controls a cell-balancing current flowing through a cell-balancing circuit; and
an entire-current measurement section that measures a current value of an entire current flowing through the entire battery section and a cell-balancing current measurement section that measures a current value of the cell-balancing current.

(2) The power storage apparatus according to (1), in which
in the cell-balancing operation, the control unit controls the cell-balancing circuit in a time division manner such that the cell-balancing current measurement section measures a current flowing into each of the power storage element sections of the battery section.

(3) The power storage apparatus according to (1) or (2), in which
the control unit determines, based on the current value of the entire current and the current value of the cell-balancing current, a charge current of each of the plurality of power storage element sections.

(4) The power storage apparatus according to any of (1), (2), and (3), in which
the entire-current measurement section and the cell-balancing current measurement section are different current measurement sections.

(5) The power storage apparatus according to any of (1), (2), and (3), in which
the entire-current measurement section and the cell-balancing current measurement section are a common current measurement section.

(6) The power storage apparatus according to (5), further including
a module terminal that is electrically connected to the battery section, in which
the common current measurement section is connected between the module terminal and the battery section.

(7) A control method for a power storage apparatus, the power storage apparatus including
a battery section in which a plurality of power storage element sections each including at least one power storage element are connected in series,
a cell-balancing circuit that is connected in parallel to the plurality of power storage element sections and performs a cell-balancing operation between the plurality of power storage element sections,
a control unit that controls a cell-balancing current flowing through a cell-balancing circuit, and
an entire-current measurement section that measures a current value of an entire current flowing through the entire battery section and a cell-balancing current measurement section that measures a current value of the cell-balancing current, the method including
measuring, by the cell-balancing current measurement section, a current flowing into each of the power storage element sections of the battery section by the control unit controlling the cell-balancing circuit in a time division manner in the cell-balancing operation.

DESCRIPTION OF SYMBOLS

Ce1, Ce2, Ce3 battery cell
AMa, AMb, AMab current measurement circuit
P, M module terminal
CB cell-balancing capacitance
VM1, VM2, VM3 voltage measurement circuit
CNT control unit
TB cell-balancing transformer

The invention claimed is:

1. A power storage apparatus, comprising:
a battery section in which a plurality of power storage element sections, each including at least one power storage element, are connected in series;
a cell-balancing circuit that is connected in parallel to the plurality of power storage element sections and is configured to execute a cell-balancing operation between the plurality of power storage element sections;
a plurality of switching elements that are connected to the at least one power storage element of each of the plurality of power storage element sections,
wherein the at least one power storage element of each of the plurality of power storage element sections is connected to the cell-balancing circuit through the corresponding switching element;
a control unit configured to control a cell-balancing current flowing through the cell-balancing circuit, and control a switching operation of each of the plurality of switching elements based on a control signal, wherein the control signal is generated based on voltage values measured across the at least one power storage element of each of the plurality of power storage element sections;
an entire-current measurement section configured to measure a current value of an entire current flowing through the battery section; and
a cell-balancing current measurement section configured to measure a current value of the cell-balancing current.

2. The power storage apparatus according to claim 1, wherein in the cell-balancing operation, the control unit is further configured to control the cell-balancing circuit in a time division manner, and wherein the cell-balancing current measurement section is configured to measure a current that flows into each of the power storage element sections of the battery section.

3. The power storage apparatus according to claim 1, wherein the control unit is further configured to determine, based on the current value of the entire current and the current value of the cell-balancing current, a charge current of each of the plurality of power storage element sections.

4. The power storage apparatus according to claim 1, wherein the entire-current measurement section and the cell-balancing current measurement section are different current measurement sections.

5. The power storage apparatus according to claim 1, wherein the entire-current measurement section and the cell-balancing current measurement section are a common current measurement section.

6. The power storage apparatus according to claim 5, further comprising a module terminal that is electrically connected to the battery section, wherein the common current measurement section is connected between the module terminal and the battery section.

7. A control method for a power storage apparatus, the method comprising:
in the power storage apparatus that includes: a battery section in which a plurality of power storage element sections, each including at least one power storage element, are connected in series; a cell-balancing circuit that is connected in parallel to the plurality of power storage element sections and is configured to execute a cell-balancing operation between the plurality of power storage element sections; a plurality of switching elements that are connected to the at least one power storage element of each of the plurality of power storage element sections, wherein the at least one power storage element of each of the plurality of power storage element sections is connected to the cell-balancing circuit through the corresponding switching element; a control unit configured to control a cell-balancing current flowing through the cell-balancing circuit, and an entire-current measurement section that measures a current value of an entire current flowing through the battery section; and a cell-balancing current measurement section that measures a current value of the cell-balancing current:

measuring, by the cell-balancing current measurement section, a current flowing into each of the power storage element sections of the battery section;

controlling, by the control unit, a switching operation of each of the plurality of switching elements based on a control signal, wherein the control signal is generated based on voltage values measured across the at least one power storage element of each of the plurality of power storage element sections; and controlling, by the control unit, the cell-balancing circuit in a time division manner in the cell-balancing operation based on the switching operation.

\* \* \* \* \*